US008625379B2

(12) United States Patent
Nakaoka

(10) Patent No.: US 8,625,379 B2
(45) Date of Patent: Jan. 7, 2014

(54) SEMICONDUCTOR STORAGE DEVICE AND ELECTRONIC APPARATUS

(71) Applicant: Fujitsu Semiconductor Limited, Yokohama (JP)

(72) Inventor: Yasuhiro Nakaoka, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/671,392

(22) Filed: Nov. 7, 2012

(65) Prior Publication Data

US 2013/0064032 A1 Mar. 14, 2013

Related U.S. Application Data

(62) Division of application No. 12/695,641, filed on Jan. 28, 2010, now Pat. No. 8,331,188.

(30) Foreign Application Priority Data

Jan. 29, 2009 (JP) .................................. 2009-17798
Sep. 30, 2009 (JP) ................................ 2009-227306

(51) Int. Cl.
G11C 5/14 (2006.01)

(52) U.S. Cl.
USPC .. 365/226; 365/227; 365/189.09; 365/230.03

(58) Field of Classification Search
USPC ......................... 365/226, 227, 189.09, 230.03
See application file for complete search history.

(56) References Cited

U.S. PATENT DOCUMENTS

| 2002/0105845 | A1 | 8/2002 | Hidaka |
| 2003/0151967 | A1* | 8/2003 | Nagai et al. ................... 365/226 |
| 2005/0213416 | A1* | 9/2005 | Aimoto ........................ 365/227 |
| 2006/0104128 | A1 | 5/2006 | Somasekhar et al. |
| 2007/0097756 | A1 | 5/2007 | Hirota et al. |
| 2007/0189086 | A1 | 8/2007 | Choi et al. |
| 2009/0027097 | A1 | 1/2009 | Kanno et al. |
| 2010/0188920 | A1* | 7/2010 | Futatsuyama et al. ........ 365/226 |

FOREIGN PATENT DOCUMENTS

JP 2008-226384 A 9/2008

* cited by examiner

Primary Examiner — Vu Le
Assistant Examiner — Han Yang
(74) Attorney, Agent, or Firm — Arent Fox LLP

(57) ABSTRACT

A semiconductor storage device includes a plurality of memory macros including a plurality of memory cell arrays; a low-potential power supply boosting circuit coupling the low-potential power supply to the ground in a normal mode and coupling the low-potential power supply to a voltage higher than a ground voltage in a sleep mode; a virtual power control circuits including a plurality of switches which is turned on when switching from the sleep mode to the normal mode and is turned off when switching from the normal mode to the sleep mode; and a sleep cancellation detecting circuit outputting, when the mode control signal supplied to the plurality of switches in one of the plurality of memory macros indicates to switch form the sleep mode to the normal mode, the mode control signal to a subsequent memory macro subsequent to the one of the plurality of memory macros.

4 Claims, 12 Drawing Sheets

SEMICONDUCTOR STORAGE DEVICE AND ELECTRONIC APPARATUS

CROSS-REFERENCE TO RELATED APPLICATIONS

This application is a Divisional of U.S. patent application Ser. No. 12/695,641, filed Jan. 28, 2010, which claims the benefit of priority from Japanese Patent Application No. 2009-17798 filed on Jan. 29, 2009 and Japanese Patent Application No. 2009-227306 filed on Sep. 30, 2009, the entire contents of which are incorporated herein by reference.

BACKGROUND

1. Field

Embodiments discussed herein relates to a semiconductor storage device.

2. Description of Related Art

To save power consumption, a sleep mode is set when a semiconductor storage device is in a standby state. In the sleep mode, a power supply voltage supplied to the semiconductor storage device decreases from the voltage level for a normal operation (normal mode).

A related technology is disclosed in, for example, Japanese Laid-open Patent Publication No. 2008-226384.

SUMMARY

According to one aspect of the embodiments, a semiconductor storage device is provided which includes: a plurality of memory macros coupled in series, each of the plurality of memory macros including a plurality of memory cell arrays; a low-potential power supply boosting circuit provided for each of the plurality of memory cell arrays, the low-potential power supply boosting circuit provided between a low-potential power supply and a ground, the low-potential power supply boosting circuit being configured to couple the low-potential power supply to the ground in a normal mode and couple the low-potential power supply to a voltage higher than a ground voltage in a sleep mode; a virtual power control circuits provided for each of the plurality of memory cell arrays, the virtual power control circuit including a plurality of switches provided in parallel with the low-potential power supply boosting circuit, the plurality of switches being configured to be turned on when a mode control signal indicates to switch from the sleep mode to the normal mode and configured to be turned off when the mode control signal indicates to switch from the normal mode to the sleep mode; and a sleep cancellation detecting circuit configured to output, when the mode control signal supplied to the plurality of switches of one of the plurality of memory arrays in one of the plurality of memory macros indicates to switch form the sleep mode to the normal mode, the mode control signal to a subsequent memory macro subsequent to the one of the plurality of memory macros.

Additional advantages and novel features of the invention will be set forth in part in the description that follows, and in part will become more apparent to those skilled in the art upon examination of the following or upon learning by practice of the invention.

DESCRIPTION OF EMBODIMENTS

In a normal mode, when data is written to a memory cell or data is read from a memory cell, a power supply voltage to a semiconductor storage device may decrease. To address the decrease in power supply voltage, a power supply voltage for preventing data stored in a memory cell from being erased, for example, a normal power supply voltage, is supplied to the semiconductor storage device.

In a sleep mode, outside input is blocked, and bit lines or word lines (not illustrated) in memory cells are not selected. A minimal power supply voltage that prevents data stored in a memory cell from being erased, for example, a minimum power supply voltage, is supplied to the semiconductor storage device.

Quick switching from the sleep mode to the normal mode may cause an increase in return current that reduces the power supply voltage, and data stored in a memory cell may disappear.

Switching from the sleep mode to the normal mode allows wiring of the semiconductor storage device or a capacitance component of a circuit to be charged to the normal power supply voltage. Quick switching from the sleep mode to the normal mode may cause return current to flow during charging.

A plurality of transistors coupled in parallel between memory cell arrays and a ground are turned on in sequence. Since the conductance increases stepwise, a current flows stepwise. The time interval for switching from the sleep mode to the normal mode may be increased, and the maximum value of return current may be reduced.

In a semiconductor storage device having a plurality of memory macros each including a plurality of memory cell arrays, the plurality of memory macros may be switched contemporaneously in response to a signal for switching from the sleep mode to the normal mode.

Figure 1:
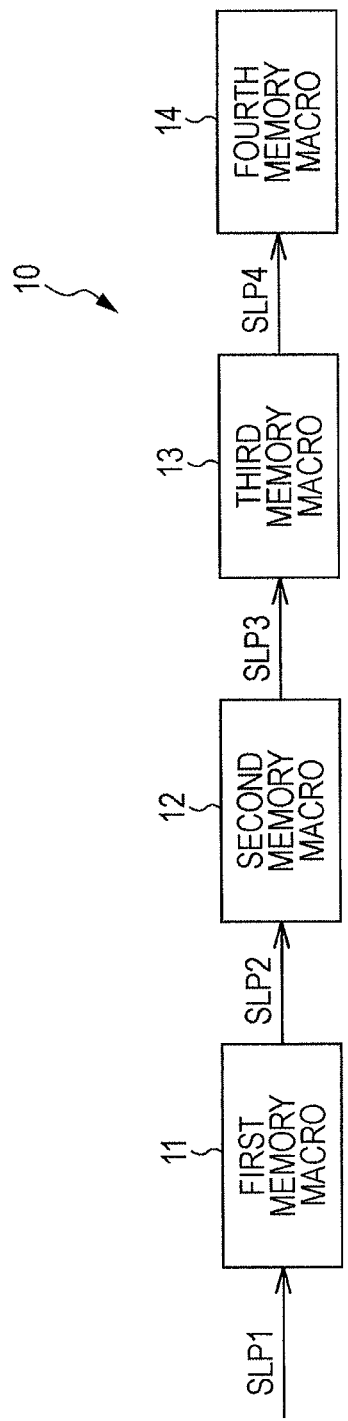
FIG. 1 illustrates an exemplary semiconductor storage device.

FIG. 1 illustrates an exemplary semiconductor storage device. A semiconductor storage device 10 includes a normal mode and a sleep mode. A first sleep signal SLP1 for setting the normal mode or the sleep mode may be input from an external device (not illustrated). In response to the first sleep signal SLP1, the semiconductor storage device 10 is set to the normal mode or the sleep mode.

The semiconductor storage device 10 is set to the normal mode in accordance with a high-level first sleep signal SLP1. The semiconductor storage device 10 is set to the sleep mode in accordance with a low-level first sleep signal SLP1.

Figure 2:
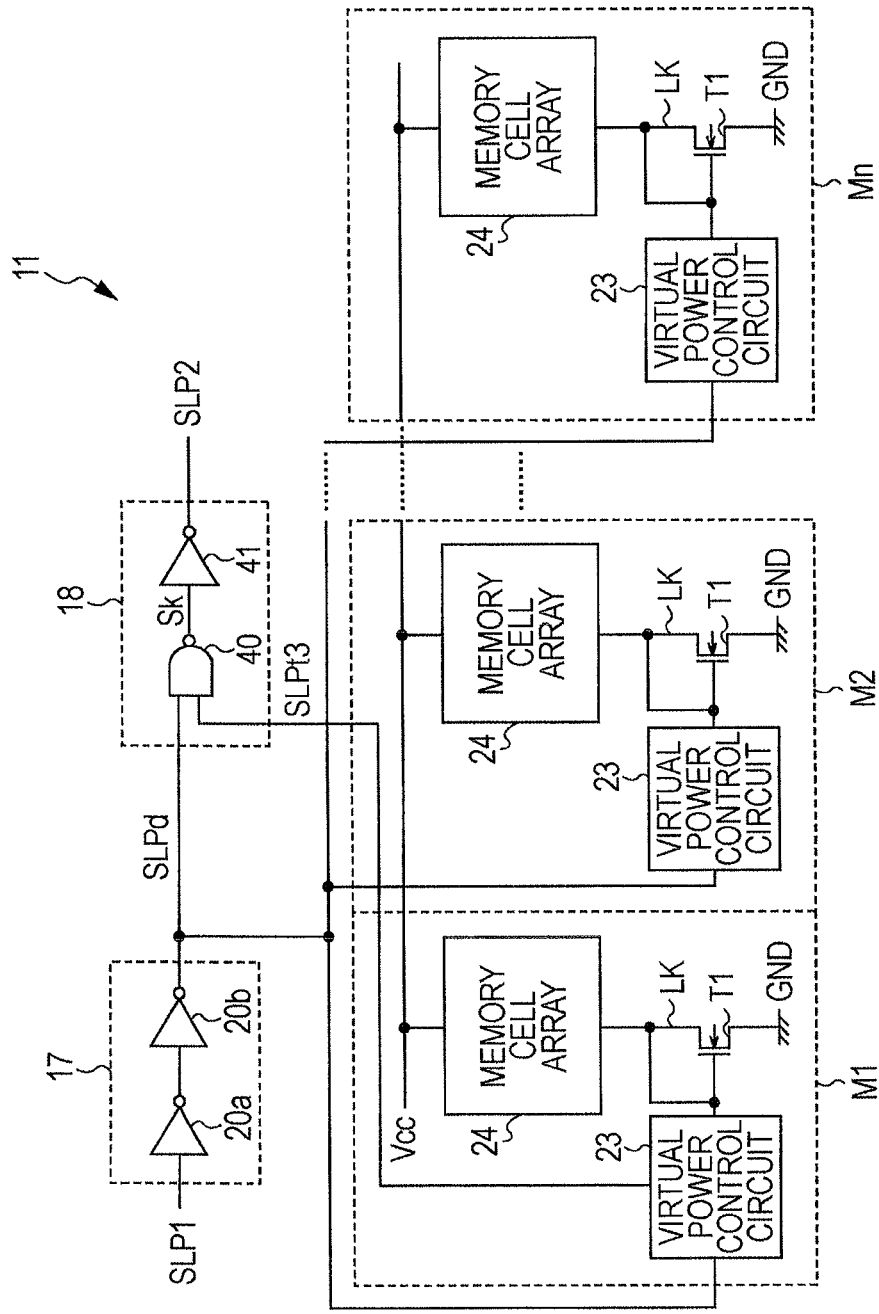
FIG. 2 illustrates an exemplary memory macro.

The semiconductor storage device 10 includes first to fourth memory macros 11 to 14. FIG. 2 illustrates an exemplary memory macro. The memory macro illustrated in FIG. 2 may be the first memory macro 11 illustrated in FIG. 1. Referring to FIG. 2, the first memory macro 11 includes a drive circuit 17, first to n-th memory cell array units M1 to Mn, and a sleep cancellation detecting circuit 18.

The drive circuit 17 includes a first inverter circuit 20a and a second inverter circuit 20b, which are coupled in series. The drive circuit 17 receives a first sleep signal SLP1 from, for example, an external device (not illustrated). The drive circuit 17 improves the drive performance of the first sleep signal SLP1 to obtain a driven sleep signal SLPd, and outputs the driven sleep signal SLPd to the first to n-th memory cell array units M1 to Mn and the sleep cancellation detecting circuit 18.

Each of the memory cell array units M1 to Mn includes a virtual power control circuit 23, a memory cell array 24, and a low-potential power supply boosting circuit. The low-potential power supply boosting circuit may include an N-channel metal oxide semiconductor (MOS) transistor T1. The virtual power control circuit 23 controls the voltage level of a virtual power supply line LK. The virtual power supply line LK may be a low-potential power supply line of the memory cell array 24. In the normal mode, the virtual power control circuit 23 couples the virtual power supply line LK to a ground potential GND. The memory cell array 24 is supplied with a power supply voltage Vcc as a high-potential power supply voltage and is supplied with the ground potential GND as a low-potential power supply voltage. In the sleep mode, the virtual power control circuit 23 controls the voltage level of the virtual power supply line LK to a threshold voltage of the N-channel MOS transistor T1. The memory cell array 24 is supplied with the power supply voltage Vcc as a high-potential power supply voltage and is supplied with the threshold voltage of the N-channel MOS transistor T1 as a low-potential power supply voltage.

In the sleep mode, the memory cell array 24 operates at a voltage that is lower than that in the normal mode by an amount corresponding to the threshold voltage of the N-channel MOS transistor T1, resulting in lower power consumption.

Figure 3:
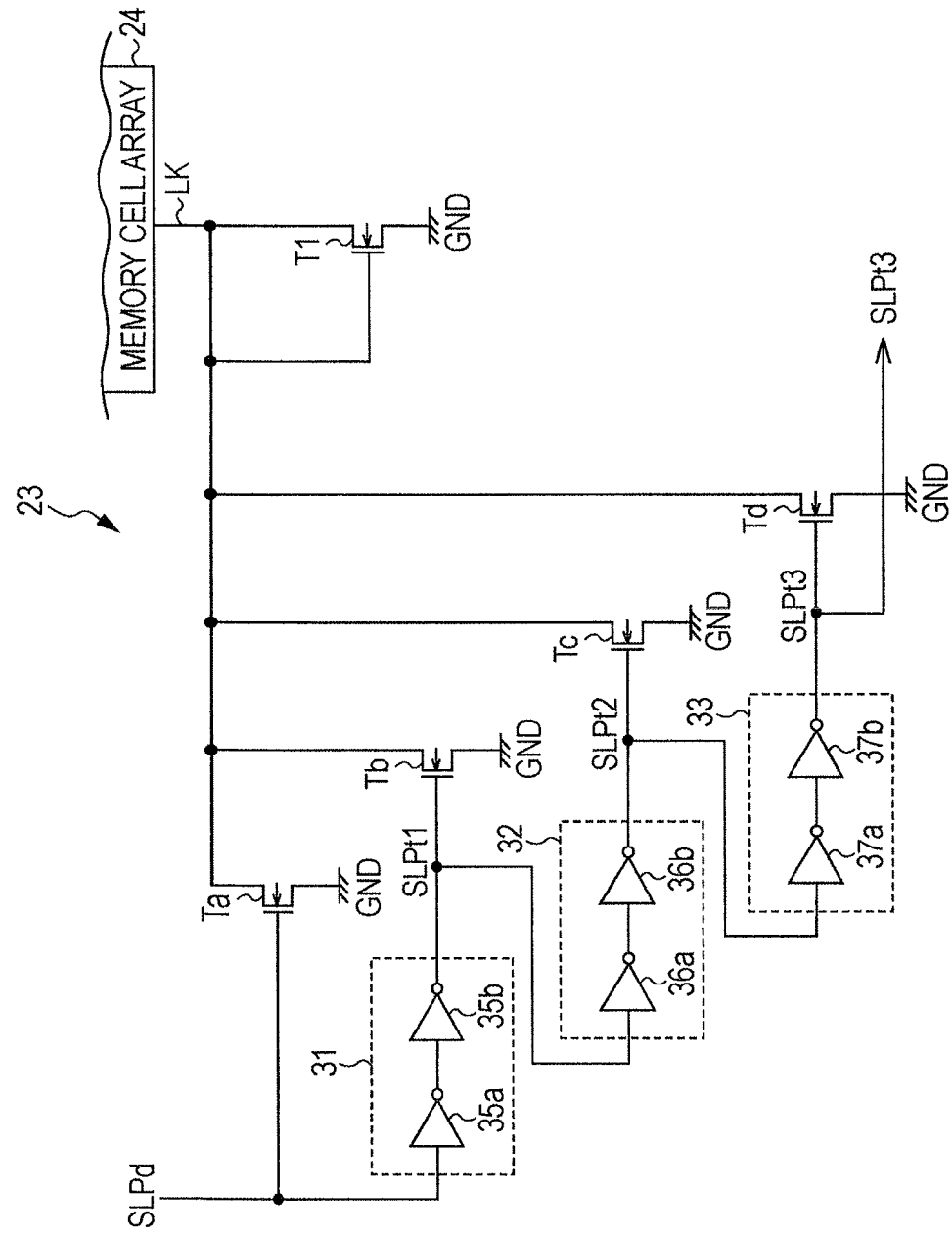
FIG. 3 illustrates an exemplary virtual power control circuit.

FIG. 3 illustrates an exemplary virtual power control circuit. The virtual power control circuit illustrated in FIG. 3 may be the virtual power control circuit 23 provided in the first memory cell array unit M1 illustrated in FIG. 2. In the virtual power control circuit 23 provided in the first memory cell array unit M1, a third delayed sleep signal SLPt3 is output to the sleep cancellation detecting circuit 18. Other configuration is substantially the same as or similar to that of the virtual power control circuits 23 provided in the second to n-th memory cell array units M2 to Mn.

The virtual power control circuit 23 provided in the first memory cell array unit M1 includes first to fourth transistors Ta to Td and first to third delay circuits 31 to 33. The first to fourth transistors Ta to Td may include an N-channel MOS transistor, and the transistor sizes of the first to fourth transistors Ta to Td may increase in this order.

The driven sleep signal SLPd output from the drive circuit 17 is supplied to the gate of the first transistor Ta, and is also supplied to the first delay circuit 31. The drain of the first transistor Ta is coupled to the virtual power supply line LK of the memory cell array 24, and the source of the first transistor Ta is coupled to the ground potential GND. In accordance with the driven sleep signal SLPd output from the drive circuit 17, the first transistor Ta connects or disconnects the virtual power supply line LK and the ground potential GND.

Upon receipt of a high-level driven sleep signal SLPd indicating, for example, the normal mode, the first transistor Ta is turned on and couples the virtual power supply line LK and the ground potential GND. Upon receipt of a low-level driven sleep signal SLPd indicating, for example, the sleep mode, the first transistor Ta is turned off and disconnects the virtual power supply line LK and the ground potential GND.

The first delay circuit 31 includes a first inverter circuit 35a and a second inverter circuit 35b, which are coupled in series. The first delay circuit 31 delays the driven sleep signal SLPd output from the drive circuit 17 by a delay time t1 to obtain a first delayed sleep signal SLPt1, and outputs the first delayed sleep signal SLPt1 to the gate of the second transistor Tb and the second delay circuit 32.

The drain of the second transistor Tb is coupled to the virtual power supply line LK, and the source of the second transistor Tb is coupled to the ground potential GND. The first delayed sleep signal SLPt1 output from the first delay circuit 31 is supplied to the gate of the second transistor Tb. In accordance with the first delayed sleep signal SLPt1 output from the first delay circuit 31, the second transistor Tb connects or disconnect the virtual power supply line LK and the ground potential GND.

The second transistor Tb is turned on and off behind the delay time t1 from the turn-on/off timing of the first transistor Ta. In accordance with a high-level first delayed sleep signal SLPt1 indicating, for example, the normal mode, the second transistor Tb is turned on and couples the virtual power supply line LK and the ground potential GND. In accordance with a low-level first delayed sleep signal SLPt1 indicating, for example, the sleep mode, the second transistor Tb is turned off and disconnects the virtual power supply line LK and the ground potential GND.

The second delay circuit 32 includes a first inverter circuit 36a and a second inverter circuit 36b, which are coupled in series. The second delay circuit 32 delays the first delayed sleep signal SLPt1 output from the first delay circuit 31 by the delay time t1 to obtain a second delayed sleep signal SLPt2, and outputs the second delayed sleep signal SLPt2 to the gate of the third transistor Tc and the third delay circuit 33.

The drain of the third transistor Tc is coupled to the virtual power supply line LK, and the source of the third transistor Tc is coupled to the ground potential GND. The second delayed sleep signal SLPt output from the second delay circuit 32 is supplied to the gate of the third transistor Tc. In accordance with the second delayed sleep signal SLPt2 output from the second delay circuit 32, the third transistor Tc connects or disconnects the virtual power supply line LK and the ground potential GND.

The third transistor Tc is turned on and off behind the delay time t1 from the turn-on/off timing of the second transistor Tb. The third transistor Tc is turned on and off behind a delay time t2 (=2×t1) from the turn-on/off timing of the first transistor Ta.

In accordance with a high-level second delayed sleep signal SLPt2 indicating, for example, the normal mode, the third transistor Tc couples the virtual power supply line LK and the ground potential GND. In accordance with a low-level second delayed sleep signal SLPt2 indicating, for example, the sleep mode, the third transistor Tc disconnects the virtual power supply line LK and the ground potential GND.

The third delay circuit 33 includes a first inverter circuit 37a and a second inverter circuit 37b, which are coupled in series. The third delay circuit 33 delays the second delayed sleep signal SLPt2 output from the second delay circuit 32 by the delay time t1 to obtain a third delayed sleep signal SLPt3, and outputs the third delayed sleep signal SLPt3 to the gate of the fourth transistor Td.

The drain of the fourth transistor Td is coupled to the virtual power supply line LK, and the source of the fourth transistor TD is coupled to the ground potential GND. The third delayed sleep signal SLPt3 output from the third delay circuit 33 is supplied to the gate of the fourth transistor Td. In accordance with the third delayed sleep signal SLPt3 output from the third delay circuit 33, the fourth transistor Td connects or disconnects the virtual power supply line LK and the ground potential GND.

The fourth transistor Td is turned on and off behind the delay time t1 from the turn-on/off timing of the third transistor Tc. The fourth transistor Td is turned on and off behind a delay time t3 (=3×t1) from the turn-on/off timing of the first transistor Ta.

The delay time t3 represents the time period, for example, beginning from the time when the first memory macro 11 starts switching from the sleep mode to the normal mode to the time when the first to fourth transistors Ta to Td are turned on so that the return current flowing during the switching becomes maximum.

In accordance with a high-level third delayed sleep signal SLPt3 indicating, for example, the normal mode, the fourth transistor Td couples the virtual power supply line LK and the ground potential GND. In accordance with a low-level third delayed sleep signal SLPt3 indicating, for example, the sleep mode, the fourth transistor Td disconnects the virtual power supply line LK and the ground potential GND.

The virtual power control circuit 23 causes a high-level driven sleep signal SLPd output from the drive circuit 17 to be sequentially delayed using the first to third delay circuits 31 to 33. Consequently, the second to fourth transistors Tb to Td are turned on with the delay times t1, t2 (=2×t1), and t3 (=3×t1), respectively, so that the virtual power supply line LK and the ground potential GND are coupled.

The virtual power control circuit 23 causes the first to fourth transistors Ta to Td to be sequentially turned on when the sleep mode is switched to the normal mode, thereby causing the conductance to increase stepwise to facilitate current flow from the virtual power supply line LK to the ground potential GND.

The virtual power control circuit 23 decreases stepwise the voltage level of the virtual power supply line LK to the ground potential GND during the switching from the sleep mode to the normal mode. A stepwise increase from the minimum power supply voltage for the sleep mode to the normal power supply voltage for the normal mode (which is greater than the minimum power supply voltage) results in an increase in the switching time. Thus, the maximum value of return current is reduced.

The memory cell array 24 in the first memory cell array unit M1 includes a plurality of memory cells arranged in a matrix (not illustrated). The memory cells store data of "1" or "0", and the data is written into the memory cells or is read from the memory cells. The power supply voltage Vcc and the voltage of the virtual power supply line LK are supplied to each of the memory cells as a high-potential power supply voltage and a low-potential power supply voltage, respectively.

In the first memory cell array unit M1, the drain and gate of the N-channel MOS transistor T1 are coupled to the virtual power supply line LK of the memory cell array 24. The source of the N-channel MOS transistor T1 is coupled to the ground potential GND. In accordance with the operation of the virtual power control circuit 23, the N-channel MOS transistor T1 connects or disconnects the virtual power supply line LK and the ground potential GND.

When the virtual power control circuit 23 disconnects the virtual power supply line LK and the ground potential GND, a standby current for the sleep mode is supplied from the memory cell array 24. Thus, the gate voltage of the N-channel MOS transistor T1 in the first memory cell array unit M1 is set around the threshold voltage, and the N-channel MOS transistor T1 is turned on. The voltage level of the virtual power supply line LK may become substantially equal to the threshold voltage of the N-channel MOS transistor T1.

When the virtual power control circuit 23 couples the virtual power supply line LK and the ground potential GND, the drain and gate of the N-channel MOS transistor T1 are coupled to the ground potential GND. Thus, the N-channel MOS transistor T1 is turned off. The voltage level of the virtual power supply line LK may become substantially equal to the ground potential GND.

The N-channel MOS transistor T1 may be turned on in the sleep mode, and the voltage level of the corresponding virtual power supply line LK may become close to the threshold voltage of the N-channel MOS transistor T1. The N-channel MOS transistor T1 may be turned off in the normal mode, and the voltage level of the corresponding virtual power supply line LK may become substantially equal to the ground potential GND.

In each of the second to n-th memory cell array units M2 to Mn, the third delayed sleep signal SLPt3 output from the third delay circuit 33 is not output to the sleep cancellation detecting circuit 18. Other configuration may be substantially the same as or similar to the configuration of the first memory cell array unit M1.

In the first to n-th memory cell array units M1 to Mn, the first to fourth transistors Ta to Td included in the virtual power control circuits 23 may be turned on and off at substantially the same time. The third delayed sleep signal SLPt3, which notifies that the first to fourth transistors Ta to Td included in the virtual power control circuit 23 in each of the memory cell array units M1 to Mn have been turned on, is output from the virtual power control circuit 23 in the first memory cell array unit M1.

The sleep cancellation detecting circuit 18 illustrated in FIG. 2 includes a NAND circuit 40 and an inverter circuit 41. The driven sleep signal SLPd output from the drive circuit 17 and the third delayed sleep signal SLPt3 output from the virtual power control circuit 23 in the first memory cell array unit M1 behind the delay time t3 from the driven sleep signal SLPd are input to the NAND circuit 40. When the input driven sleep signal SLPd and third delayed sleep signal SLPt3 are at a high level, the NAND circuit 40 outputs a low-level control completion signal Sk to the inverter circuit 41.

The inverter circuit 41 inverts the control completion signal Sk output from the NAND circuit 40 to obtain a second sleep signal SLP2, and outputs the second sleep signal SLP2 to the second memory macro 12.

When the first to fourth transistors Ta to Td of the virtual power control circuits 23 included in the first to n-th memory cell array units M1 to Mn are turned on, the sleep cancellation detecting circuit 18 outputs a high-level second sleep signal SLP2 indicating, for example, the normal mode in accordance with a high-level third delayed sleep signal SLPt3 output from the virtual power control circuit 23 in the first memory cell array unit M1.

When the first to fourth transistors Ta to Td of the virtual power control circuits 23 included in the first to n-th memory cell array units M1 to Mn are turned off, the sleep cancellation detecting circuit 18 outputs a low-level second sleep signal SLP2 in accordance with a low-level driven sleep signal SLPd output from the drive circuit 17.

When the time period from when the first memory cell array unit M1 starts switching from the sleep mode to the normal mode to when the first to fourth transistors Ta to Td are turned on so that the return current is maximized, for example, the delay time t3 (=3×t1), has elapsed, the sleep cancellation detecting circuit 18 outputs a high-level second sleep signal SLP2 indicating, for example, the normal mode to the second memory macro 12. In accordance with the second sleep signal SLP2, the second memory macro 12 starts switching from the sleep mode to the normal mode.

The configuration of the second to fourth memory macros 12 to 14 may be substantially the same as or similar to the configuration of the first memory macro 11.

Figure 4:
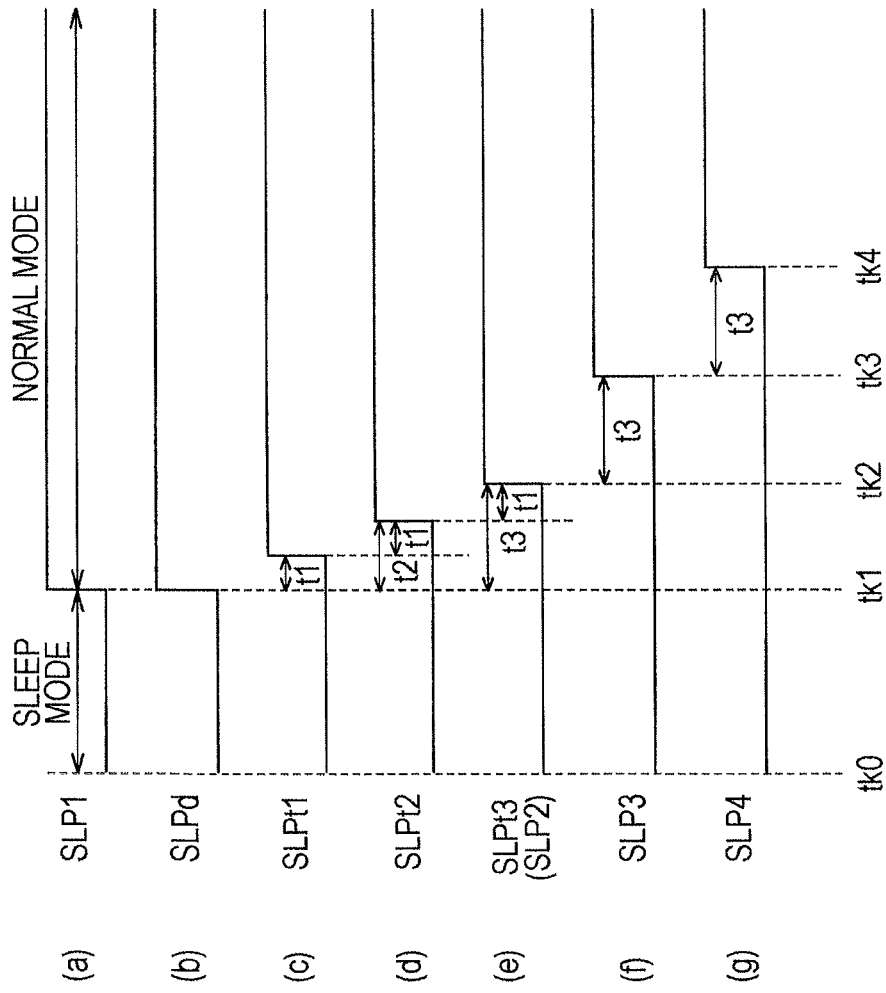
FIG. 4 illustrates an exemplary switching operation from a sleep mode to a normal mode.

FIG. 4 illustrates an exemplary switching operation from a sleep mode to a normal mode. The switching operation illustrated in FIG. 4 may be performed by the semiconductor storage device 10 illustrated in FIG. 1. At time tk0, the semiconductor storage device 10 is set to the sleep mode in accordance with a low-level first sleep signal SLP1 output from an external device.

As illustrated in part (a) of FIG. 4, at time tk1, the first sleep signal SLP1 output from the external device rises from a low level to a high level. The external device outputs the high-level first sleep signal SLP1 to the drive circuit 17 in the first memory macro 11 in order to switch the semiconductor storage device 10 from the sleep mode to the normal mode.

As illustrated in part (b) of FIG. 4, at time tk1, the driven sleep signal SLPd output from the drive circuit 17 in the first memory macro 11 changes from a low level to a high level. The drive circuit 17 in the first memory macro 11 improves the drive performance of the first sleep signal SLP1 input from the external device to obtain a driven sleep signal SLPd, and outputs the driven sleep signal SLPd to the gate of the first transistors Ta, the first delay circuits 31, and the sleep cancellation detecting circuit 18 in the first memory macro 11. In accordance with a high-level driven sleep signal SLPd, the first transistors Ta in the first memory macro 11 couple the virtual power supply lines LK and the ground potential GND.

As illustrated in part (c) of FIG. 4, the first delayed sleep signal SLPt1 output from the first delay circuits 31 in the first memory macro 11 changes from a low level to a high level. The first delay circuits 31 in the first memory macro 11 delay the driven sleep signal SLPd input from the drive circuits 17 by the delay time t1 to obtain a first delayed sleep signal SLPt1, and output the first delayed sleep signal SLPt1 to the gates of the second transistors Tb and the second delay circuits 32 in the first memory macro 11. In accordance with a high-level first delayed sleep signal SLPt1, the second transistors Tb in the first memory macro 11 couple the virtual power supply lines LK and the ground potential GND.

As illustrated in part (d) of FIG. 4, the second delayed sleep signal SLPt2 output from the second delay circuits 32 in the first memory macro 11 changes from a low level to a high level. The second delay circuits 32 in the first memory macro 11 delay the first delayed sleep signal SLPt1 input from the first delay circuits 31 by the delay time t1 to obtain a second delayed sleep signal SLPt2, and output the second delayed sleep signal SLPt2 to the gates of the third transistors Tc and the third delay circuits 33 in the first memory macro 11. In accordance with a high-level second delayed sleep signal SLPt2, the third transistors Tc in the first memory macro 11 couple the virtual power supply lines LK and the ground potential GND.

As illustrated in part (e) of FIG. 4, the third delayed sleep signal SLPt3 output from the third delay circuits 33 in the first memory macro 11 changes from a low level to a high level. The third delay circuits 33 in the first memory macro 11 delay the second delayed sleep signal SLPt2 input from the second delay circuits 32 by the delay time t1 to obtain a third delayed sleep signal SLPt3, and output the third delayed sleep signal SLPt3 to the gates of the fourth transistors Td and the sleep cancellation detecting circuit 18 in the first memory macro 11.

In accordance with a high-level third delayed sleep signal SLPt3, the fourth transistors Td in the first memory macro 11 couple the virtual power supply lines LK and the ground potential GND. When the high-level driven sleep signal SLPd is input and then the third delayed sleep signal SLPt3 output from the third delay circuits 33 changes from a low level to a high level, the sleep cancellation detecting circuit 18 in the first memory macro 11 outputs a high-level second sleep signal SLP2 indicating, for example, the normal mode to the second memory macro 12.

The first memory macro 11 delays a high-level first sleep signal SLP1 indicating, for example, the normal mode, which is input from an external device, by the delay time t3 (=3×t1) and detects that the virtual power supply lines LK and the ground potential GND are coupled by the first to fourth transistors Ta to Td in the first memory macro 11 turning on. Then, the first macro 11 outputs a high-level second sleep signal SLP2 indicating, for example, the normal mode to the second memory macro 12.

As illustrated in part (f) of FIG. 4, at time tk3, a third sleep signal SLP3 output from the sleep cancellation detecting circuit 18 in the second memory macro 12 changes from a low level to a high level. As illustrated in part (g) of FIG. 4, at time tk4, a fourth sleep signal SLP4 output from the sleep cancellation detecting circuit 18 in the third memory macro 13 changes from a low level to a high level.

The second memory macro 12 delays a high-level second sleep signal SLP2 indicating, for example, the normal mode, which is input from the first memory macro 11, by the delay time t3 (=3×t1) and outputs a high-level third sleep signal SLP3 indicating, for example, the normal mode to the third memory macro 13 after detecting that the virtual power supply lines LK and the ground potential GND are coupled by the first to fourth transistors Ta to Td in the second memory macro 12 turning on.

The third memory macro 13 delays a high-level third sleep signal SLP3 indicating, for example, the normal mode, which is input from the second memory macro 12, by the delay time t3 (=3×t1) and outputs a high-level fourth sleep signal SLP4 indicating, for example, the normal mode to the fourth memory macro 14 after detecting the virtual power supply lines LK and the ground potential ND are coupled by the first to fourth transistors Ta to Td in the third memory macro 13 turning on.

When a high-level first sleep signal SLP1 indicating, for example, the normal mode is input to the first memory macro 11, the first to fourth memory macros 11 to 14 sequentially start switching from the sleep mode to the normal mode with the delay time t3 (=3×t1).

The sleep cancellation detecting circuit 18 detects the third delayed sleep signal SLPt3 output from the virtual power control circuit 23 in the first memory cell array unit M1. The fourth transistor Td in the first memory cell array unit M1 determines whether or not the virtual power supply line LK and the ground potential GND are coupled. When a high-level third delayed sleep signal SLPt3 is input, the sleep cancellation detecting circuit 18 outputs a high-level second sleep signal SLP2 indicating, for example, the normal mode to the sequent second memory macro 12.

The configuration of the first memory cell array unit M1 may be substantially the same as or similar to the configuration of the second to n-th memory cell array units M2 to Mn. When the fourth transistor Td in the first memory cell array unit M1 is turned on, the fourth transistors Td in the second to n-th memory cell array units M2 to Mn may also be turned on.

The sleep cancellation detecting circuit 18 determines whether or not the first to fourth transistors Ta to Td of the virtual power control circuits 23 included in the first to n-th memory cell array units M1 to Mn are turned on. The connection between the virtual power supply lines LK and the ground potential GND may be detected.

After return current becomes substantially a maximum in a given memory macro, the mode of the subsequent memory macro is switched from the sleep mode to the normal mode. The return current in the semiconductor storage device 10 is lower than that when the first to fourth memory macros 11 to 14 are switched from the sleep mode to the normal mode contemporaneously, and the decrease in the power supply voltage Vcc may be reduced.

Figure 5:
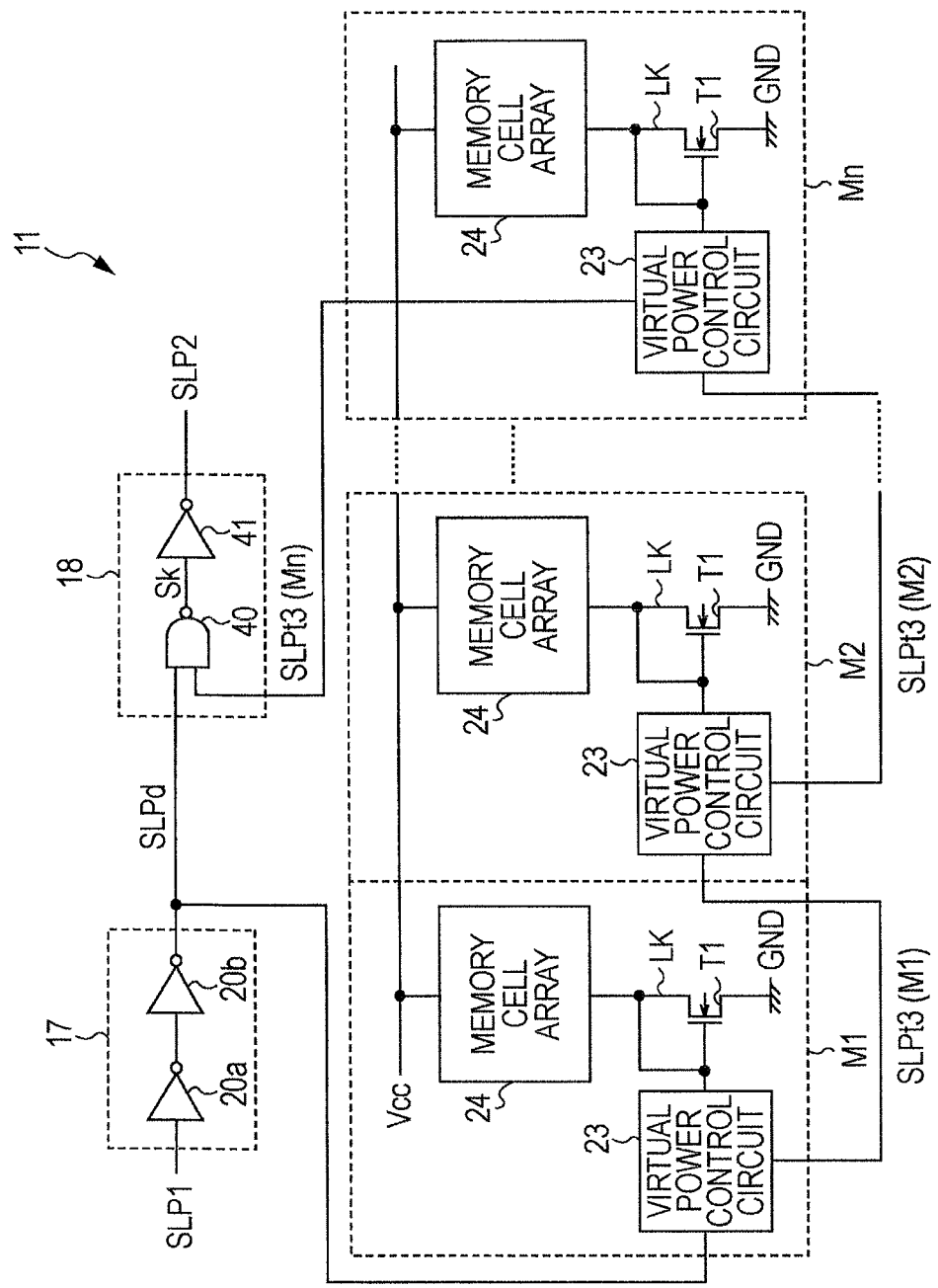
FIG. 5 illustrates an exemplary memory macro.

FIG. 5 illustrates an exemplary memory macro. A driven sleep signal SLPd output from a drive circuit 17 is input to a virtual power control circuit 23 in a first memory cell array unit M1. A third delayed sleep signal SLPt3 output from the virtual power control circuit 23 in the first memory cell array unit M1 is output to a virtual power control circuit 23 in the subsequent second memory cell array unit M2. In first to n-th memory cell array units M1 to Mn, a third delayed sleep signal SLPt3 output from a given memory cell array unit is supplied to the subsequent memory cell array unit. The third delayed sleep signal SLPt3 output from the last n-th memory cell array unit Mn is supplied to the sleep cancellation detecting circuit 18.

In the first to n-th memory cell array units M1 to Mn in each memory macro, after the first to fourth transistors Ta to Td in the virtual power control circuit 23 included in a given memory cell array unit are turned on, the first to fourth transistors Ta to Td in the virtual power control circuit 23 included in the subsequent memory cell array unit may be turned on.

In the first to n-th memory cell array units M1 to Mn, when the delay time t3 elapses since a given memory cell array unit starts switching from the sleep mode to the normal mode, the subsequent memory cell array unit starts switching from the sleep mode to the normal mode.

The first to n-th memory cell array units M1 to Mn sequentially start switching from the sleep mode to the normal mode. When the first to fourth transistors Ta to Td in the last n-th memory cell array unit Mn are turned on, the sleep cancellation detecting circuit 18 outputs second to fourth sleep signals SLP2 to SLP4, which are at a high level, to the subsequent memory macro.

The virtual power control circuit 23 is supplied with the third delayed sleep signal SLPt3 output from the virtual power control circuit 23 in the preceding memory cell array unit. The sleep cancellation detecting circuit 18 detects the voltage level of the third delayed sleep signal SLPt3 output from the virtual power control circuit 23 in the last n-th memory cell array unit Mn.

After the first to fourth transistors Ta to Td in a given memory cell array unit are turned on, the first to fourth transistors Ta to Td in the subsequent memory cell array unit may be turned on. After the first to fourth transistors Ta to Td in the last n-th memory cell array unit Mn are turned on, the subsequent memory macro starts switching from the sleep mode to the normal mode.

After return current becomes substantially a maximum in each of the memory cell array units M1 to Mn, the subsequent memory cell array unit starts switching from the sleep mode to the normal mode. The return current in the semiconductor storage device 10 may be reduced, and the decrease in the power supply voltage Vcc may be reduced.

Figure 6:
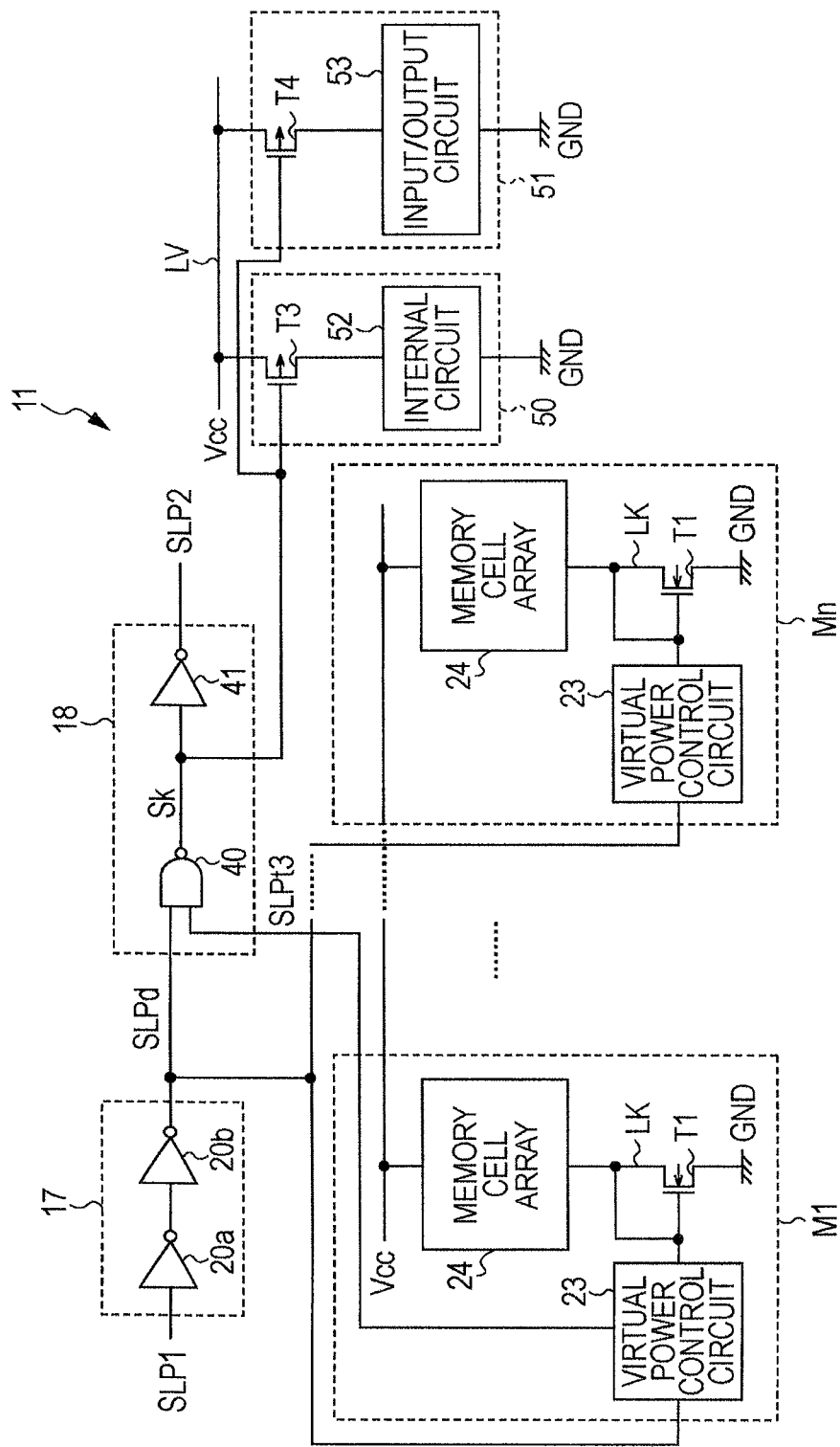
FIG. 6 illustrates an exemplary memory macro.

FIG. 6 illustrates an exemplary memory macro. A first memory macro 11 includes a drive circuit 17, first to n-th memory cell array units M1 to Mn, a sleep cancellation detecting circuit 18, an internal circuit unit 50, and an input/output unit 51.

The first memory macro 11 illustrated in FIG. 6 may be included in the semiconductor storage device 10 illustrated in FIG. 1. The first memory macro 11 is switched to the normal mode or the sleep mode in accordance with a first sleep signal SLP1 input from an external device (not illustrated).

The drive circuit 17 includes a first inverter circuit 20a and a second inverter circuit 20b, which are coupled in series. A first sleep signal SLP1 is input to the drive circuit 17 from an external device (not illustrated). In the drive circuit 17, the first sleep signal SLP1 is supplied to the second inverter circuit 20b which has high driving performance to obtain a driven sleep signal SLPd, and the driven sleep signal SLPd is output to the first to n-th memory cell array units M1 to Mn and the sleep cancellation detecting circuit 18.

Each of the memory cell array units M1 to Mn includes a virtual power control circuit 23, a memory cell array 24, and an N-channel MOS transistor T1 serving as a low-potential power supply boosting circuit. The virtual power control circuit 23 controls the voltage level of a virtual power supply line LK, which is, for example, a low-potential power supply voltage of the memory cell array 24. In the normal mode, the virtual power control circuit 23 couples the virtual power supply line LK to a ground potential GND. The memory cell array 24 is supplied with a power supply voltage Vcc as a high-potential power supply voltage, and is coupled to the ground potential GND as a low-potential power supply voltage. In the sleep mode, the virtual power control circuit 23 controls the voltage level of the virtual power supply line LK to a threshold voltage of the N-channel MOS transistor T1. The memory cell array 24 is supplied with the power supply voltage Vcc as a high-potential power supply voltage and is also supplied with, as a low-potential power supply voltage, a voltage obtained by boosting the ground potential GND by the threshold voltage of the N-channel MOS transistor T1.

In the sleep mode, a power supply voltage that is lower than that in the normal mode by the threshold voltage of the N-channel MOS transistor T1 is supplied to the memory cell array 24, resulting in lower power consumption.

The configuration of the virtual power control circuit 23 included in the first memory cell array unit M1 is substantially the same as or similar to the configuration of the virtual power control circuit 23 illustrated in FIG. 1. For example, as illustrated in FIG. 3, the virtual power control circuit 23 included in the first memory cell array unit M1 includes first to fourth transistors Ta to Td and first to third delay circuits 31 to 33. The first to fourth transistors Ta to Td may be N-channel MOS transistors, and the transistor sizes of the first to fourth transistors Ta to Td may increase in this order.

The driven sleep signal SLPd output from the drive circuit 17 is supplied to the gate of the first transistor Ta, and is also supplied to the first delay circuit 31. A drain of the first transistor Ta is coupled to the virtual power supply line LK of the memory cell array 24, and a source of the first transistor Ta is coupled to the ground potential GND. In accordance with the driven sleep signal SLPd output from the drive circuit 17, the first transistor Ta connects or disconnects the virtual power supply line LK and the ground potential GND.

In the normal mode, for example, when a high-level driven sleep signal SLPd is input, the first transistor Ta is turned on and couples the virtual power supply line LK and the ground potential GND. In the sleep mode, when a low-level driven sleep signal SLPd is input, the first transistor Ta is turned off and disconnects the virtual power supply line LK and the ground potential GND.

The first delay circuit 31 includes a first inverter circuit 35a and a second inverter circuit 35b, which are coupled in series. When a driven sleep signal SLPd is input from the drive circuit 17, the first delay circuit 31 delays the driven sleep signal SLPd by the delay time t1 to obtain a first delayed sleep signal SLPt1, and outputs the first delayed sleep signal SLPt1 to the gate of the second transistor Tb and the second delay circuit 32.

A drain of the second transistor Tb is coupled to the virtual power supply line LK, and a source of the second transistor Tb is coupled to the ground potential GND. The first delayed sleep signal SLPt1 output from the first delay circuit 31 is supplied to a gate of the second transistor Tb. In accordance with the first delayed sleep signal SLPt1 output from the first delay circuit 31, the second transistor Tb connects or disconnects the virtual power supply line LK and the ground potential GND.

The second transistor Tb operates behind the delay time t1 from the operation timing of the first transistor Ta. In the normal mode, for example, when a high-level first delayed sleep signal SLPt1 is input, the second transistor Tb is turned on and couples the virtual power supply line LK and the ground potential GND. In the sleep mode, for example, when a low-level first delayed sleep signal SLPt1 is input, the second transistor Tb is turned off and disconnects the virtual power supply line LK and the ground potential GND.

The second delay circuit 32 includes a first inverter circuit 36a and a second inverter circuit 36b, which are coupled in series. The second delay circuit 32 delays the first delayed sleep signal SLPt1 input from the first delay circuit 31 by the delay time t1 to obtain a second delayed sleep signal SLPt2, and outputs the second delayed sleep signal SLPt2 to the gate of the third transistor Tc and the third delay circuit 33.

A drain of the third transistor Tc is coupled to the virtual power supply line LK, and a source of the third transistor Tc is coupled to the ground potential GND. The second delayed sleep signal SLPt2 output from the second delay circuit 32 is supplied to a gate of the third transistor Tc. In accordance with the second delayed sleep signal SLPt2 input from the second delay circuit 32, the third transistor Tc connects or disconnects the virtual power supply line LK and the ground potential GND.

The third transistor Tc operates behind the delay time t1 from the operation timing of the second transistor Tb. The third transistor Tc operates behind the delay time t2 ($=2 \times t1$) from the operation timing of the first transistor Ta.

In the normal mode, for example, when a high-level second delayed sleep signal SLPt2 is input, the third transistor Tc is turned on and couples the virtual power supply line LK and the ground potential GND. In the sleep mode, for example, when a low-level second delayed sleep signal SLPt2 is input, the third transistor Tc is turned off and disconnects the virtual power supply line LK and the ground potential GND.

The third delay circuit 33 includes a first inverter circuit 37a and a second inverter circuit 37b, which are coupled in series. The third delay circuit 33 delays the second delayed sleep signal SLPt2 output from the second delay circuit 32 by the delay time t1 to obtain a third delayed sleep signal SLPt3, and outputs the third delayed sleep signal SLPt3 to the gate of the fourth transistor Td.

A drain of the fourth transistor Td is coupled to the virtual power supply line LK, and a source of the fourth transistor Td is coupled to the ground potential GND. The third delayed sleep signal SLPt3 output from the third delay circuit 33 is supplied to a gate of the fourth transistor Td. In accordance with the third delayed sleep signal SLPt3 output from the third delay circuit 33, the fourth transistor Td connects or disconnects the virtual power supply line LK and the ground potential GND.

The fourth transistor Td operates behind the delay time t1 from the operation timing of the third transistor Tc. The fourth transistor Td operates behind the delay time t3 ($=3 \times t1$) from the operation timing of the first transistor Ta.

The delay time t3 may correspond to the time period from when the first memory macro 11 starts switching from the sleep mode to the normal mode to when return current flowing during the switching from the sleep mode to the normal mode becomes substantially maximum by the first to fourth transistors Ta to Td turning on.

In the normal mode, for example, when a high-level third delayed sleep signal SLPt3 is input, the fourth transistor Td is turned on and couples the virtual power supply line LK and the ground potential GND. In the sleep mode, for example, when a low-level third delayed sleep signal SLPt3 is input, the fourth transistor Td is turned off and disconnects the virtual power supply line LK and the ground potential GND.

The virtual power control circuit 23 sequentially delays the high-level driven sleep signal SLPd input from the drive circuit 17 using the first to third delay circuits 31 to 33 to turn on the second to fourth transistors Tb to Td with the delay times t1, t2 ($=2 \times t1$), and t3 ($=3 \times t1$), respectively, so that the virtual power supply line LK and the ground potential GND are coupled to each other.

The virtual power control circuit 23 turns on the first to fourth transistors Ta to Td sequentially when the sleep mode is switched to the normal mode. Therefore, the conductance is increased stepwise and current flow from the virtual power supply line LK to the ground potential GND is facilitated.

The virtual power control circuit 23 decreases stepwise the voltage level of the virtual power supply line LK to the ground potential GND during the switching from the sleep mode to the normal mode, and increases stepwise the power supply voltage from the minimum power supply voltage for the sleep mode to the normal power supply voltage for the normal mode (which is greater than the minimum power supply voltage), resulting in an increase in the switching time. Thus, the maximum value of return current may be reduced.

The memory cell array 24 in the first memory cell array unit M1 includes a plurality of memory cells arranged in a matrix (not illustrated). The memory cells store data of "1" or "0", and the data is written into or read from the memory cells. The power supply voltage Vcc and the voltage of the virtual power supply line LK are supplied to each of the memory cells as a high-potential power supply voltage and a low-potential power supply voltage, respectively.

A drain and a gate of the N-channel MOS transistor T1 in the first memory cell array unit M1 are coupled to the virtual power supply line LK of the memory cell array 24, and a source of the N-channel MOS transistor T1 is coupled to the ground potential GND. The N-channel MOS transistor T1 connects or disconnects the virtual power supply line LK and the ground potential GND using the virtual power control circuit 23.

When the virtual power supply line LK and the ground potential GND are disconnected by the virtual power control circuit 23, a standby current of the memory cell array 24 in the sleep mode is supplied to the N-channel MOS transistor T1 in the first memory cell array unit M1. Thus, the gate voltage is set around the threshold voltage so that the N-channel MOS transistor T1 is turned on. The voltage level of the virtual power supply line LK becomes substantially equal to the threshold voltage of the N-channel MOS transistor T1.

When the virtual power supply line LK and the ground potential GND are coupled by the virtual power control circuit 23, the drain and gate of the N-channel MOS transistor T1 are coupled to the ground potential GND to turn off the N-channel MOS transistor T1. The voltage level of the virtual power supply line LK becomes substantially equal to the ground potential GND.

The N-channel MOS transistor T1 is turned on in the sleep mode, and the voltage level of the virtual power supply line LK becomes close to the threshold voltage of the N-channel MOS transistor T1. The N-channel MOS transistor T1 is turned off in the normal mode, and the voltage level of the virtual power supply line LK becomes substantially equal to the ground potential GND.

In the second to n-th memory cell array units M2 to Mn, the virtual power control circuits 23 may not output the third delayed sleep signal SLPt3 supplied from the third delay circuits 33 to the sleep cancellation detecting circuit 18. Other configuration of the virtual power control circuits 23 in the second to n-th memory cell array units M2 to Mn may be substantially the same as or similar to the configuration of the virtual power control circuit 23 in the first memory cell array unit M1.

In the first to n-th memory cell array units M1 to Mn, the first to fourth transistors Ta to Td included in the virtual power control circuits 23 may operate at substantially the same time. The third delayed sleep signal SLPt3, which indicates that the first to fourth transistors Ta to Td included in the virtual power control circuit 23 in each of the memory cell array units M1 to Mn are turned on, may be output from the virtual power control circuit 23 in the first memory cell array unit M1.

As illustrated in FIG. 6, the sleep cancellation detecting circuit 18 in the first memory macro 11 includes a NAND circuit 40 and an inverter circuit 41. The driven sleep signal SLPd output from the drive circuit 17 and the third delayed sleep signal SLPt3, which is obtained by delaying the driven sleep signal SLPd output from the virtual power control circuit 23 in the first memory cell array unit M1 by the delay time t3, are input to the NAND circuit 40. When the driven sleep signal SLPd and the third delayed sleep signal SLPt3 are at a high level, the NAND circuit 40 outputs a low-level control completion signal Sk to the inverter circuit 41, the internal circuit unit 50, and the input/output unit 51.

The inverter circuit 41 receives a control completion signal Sk from the NAND circuit 40. The inverter circuit 41 inverts the control completion signal Sk to obtain a second sleep signal SLP2, and outputs the second sleep signal SLP2 to the second memory macro 12.

When the first to fourth transistors Ta to Td of the virtual power control circuits 23 included in the first to n-th memory cell array units M1 to Mn are turned on, in response to the high-level third delayed sleep signal SLPt3 output from the virtual power control circuit 23 in the first memory cell array unit M1, the sleep cancellation detecting circuit 18 outputs a low-level control completion signal Sk to the internal circuit unit 50 and the input/output unit 51, and further outputs a high-level second sleep signal SLP2 indicating the normal mode to the second memory macro 12.

When the first to fourth transistors Ta to Td of the virtual power control circuits 23 included in the first to n-th memory cell array units M1 to Mn are turned off, in accordance with a low-level driven sleep signal SLPd output from the drive circuit 17, the sleep cancellation detecting circuit 18 outputs a high-level control completion signal Sk to the internal circuit unit 50 and the input/output unit 51, and further outputs a low-level second sleep signal SLP2 to the second memory macro 12.

The internal circuit unit 50 includes an internal circuit 52 and a power control transistor T3. The internal circuit 52 may be a peripheral circuit such as a decoder for selecting a word line and a bit line. The power control transistor T3 may be a P-channel MOS transistor. A source of the power control transistor T3 is coupled to a power supply line LV and a drain of the power control transistor T3 is coupled to the internal circuit 52. A control completion signal Sk from the sleep cancellation detecting circuit 18 is supplied to a gate of the power control transistor T3. In accordance with the control completion signal Sk, the power control transistor T3 supplies a power supply voltage Vcc to the internal circuit 52 or disconnects the supply of the power supply voltage Vcc.

In accordance with a high-level control completion signal Sk, the power control transistor T3 is turned off and disconnects the power supply line LV and the internal circuit 52 so that the power supply voltage Vcc is not supplied to the internal circuit 52. In accordance with a low-level control completion signal Sk, the power control transistor T3 is turned on and couples the power supply line LV and the internal circuit 52 so that the power supply voltage Vcc is supplied to the internal circuit 52.

The input/output unit 51 includes an input/output circuit 53 and a power control transistor T4. The input/output circuit 53 supplies a data signal, an address signal, or the like to the memory cells. The power control transistor T4 may be a P-channel MOS transistor. A source of the power control transistor T4 is coupled to the power supply line LV and a drain of the power control transistor T4 is coupled to the input/output circuit 53. A control completion signal Sk from the sleep cancellation detecting circuit 18 is supplied to a gate of the power control transistor T4. In accordance with the control completion signal Sk, the power control transistor T4 supplies the power supply voltage Vcc to the input/output circuit 53 or disconnects the supply of the power supply voltage Vcc.

In accordance with a high-level control completion signal Sk, the power control transistor T4 is turned off and disconnects the power supply line LV and the input/output circuit 53 so that the power supply voltage Vcc is not supplied to the input/output circuit 53. In accordance with a low-level control completion signal Sk, the power control transistor T4 is turned on and couples the power supply line LV and the input/output circuit 53 so that the power supply voltage Vcc is supplied to the input/output circuit 53.

The sleep cancellation detecting circuit 18 in the first memory macro 11 starts to switch the first memory cell array unit M1 from the sleep mode to the normal mode. When detecting that the first to fourth transistors Ta to Td are turned on and that the return current becomes substantially maximum, for example, when the delay time t3 (=3×t1) has elapsed, the sleep cancellation detecting circuit 18 outputs a low-level control completion signal Sk to the power control transistor T3 in the internal circuit unit 50 and the power control transistor T4 in the input/output unit 51 to start the power supply to the internal circuit 52 and the input/output circuit 53.

In the subsequent memory macros 12 to 14, when the second to fourth sleep signals SLP2 to SLP4 are input from the preceding first to third memory macros 11 to 13, respectively, as in the first memory macro 11, the sleep cancellation detecting circuits 18 start to switch the first memory cell array units M1 from the sleep mode to the normal mode. When detecting that the first to fourth transistors Ta to Td are turned on and that the return current becomes substantially maximum, for example, when the delay time t3 (=3×t1) has elapsed, the sleep cancellation detecting circuits 18 output a low-level control completion signal Sk to the power control transistors T3 in the corresponding internal circuit units 50 and the power control transistors T4 in the corresponding input/output units 51 to start the power supply to the internal circuits 52 and the input/output circuits 53.

In each of the first to fourth memory macros 11 to 14, upon detecting that the low-potential voltage to be applied to the memory cell arrays 24, for example, the potential of the virtual power supply lines LK is decreased stepwise to the power supply voltage for the normal mode by the virtual power control circuits 23 during the switching from the sleep mode to the normal mode, the sleep cancellation detecting circuit 18 supplies the power supply voltage Vcc to the internal circuit 52 and the input/output circuit 53. Therefore, power supply noise may be reduced.

In each of the first to fourth memory macros 11 to 14, during the sleep mode, the sleep cancellation detecting circuit 18 stops the supply of the power supply voltage Vcc to the internal circuit 52 and the input/output circuit 53, thereby the power consumption in the internal circuit 52 and the input/output circuit 53 is reduced.

Figure 7:
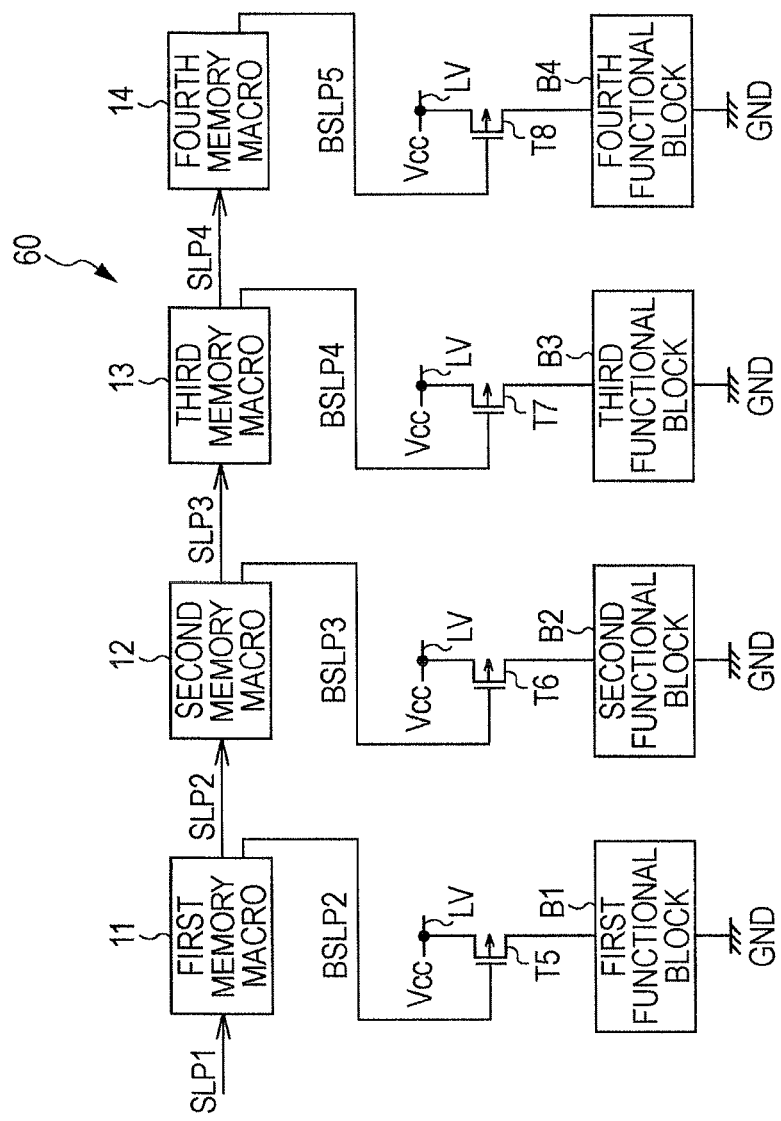
FIG. 7 illustrates an exemplary semiconductor device.

FIG. 7 illustrates an exemplary semiconductor device. In FIG. 7, elements that are substantially the same as the elements illustrated in FIGS. 1 to 6 are assigned the same reference numerals, and the explanation may be omitted or reduced.

In a semiconductor device 60 illustrated in FIG. 7, first to fourth memory macros 11 to 14 may control the supply of a power supply voltage Vcc to first to fourth functional blocks B1 to B4 in accordance with a completion signal Sk.

The semiconductor device 60 includes the first to fourth memory macros 11 to 14, the first to fourth functional blocks B1 to B4, and first to fourth power control transistors T5 to T8. The first memory macro 11 outputs, for example, the control completion signal Sk illustrated in FIG. 6, which is supplied from the NAND circuit 40 in the sleep cancellation detecting circuit 18 provided in the first memory macro 11, to the first power control transistor T5 as a second inverted sleep signal BSLP2. The second memory macro 12 outputs the control completion signal Sk supplied from the NAND circuit 40 in the sleep cancellation detecting circuit 18 provided in the second memory macro 12 to the second power control transistor T6 as a third inverted sleep signal BSLP3.

The third memory macro 13 outputs the control completion signal Sk supplied from the NAND circuit 40 in the sleep cancellation detecting circuit 18 provided in the third memory macro 13 to the third power control transistor T7 as a fourth inverted sleep signal BSLP4. The fourth memory macro 14 outputs the control completion signal Sk supplied from the NAND circuit 40 in the sleep cancellation detecting circuit 18 provided in the fourth memory macro 14 to the fourth power control transistor T8 as a fifth inverted sleep signal BSLP5.

The first power control transistor T5 may be a P-channel MOS transistor. A source of the first power control transistor T5 is coupled to the power supply line LV and a drain of the first power control transistor T5 is coupled to the first functional block B1. A second inverted sleep signal BSLP2 from the first memory macro 11 is supplied to a gate of the first power control transistor T5. In accordance with the second inverted sleep signal BSLP2, the first power control transistor T5 supplies the power supply voltage Vcc to the first functional block B1.

During the sleep mode, for example, when a high-level second inverted sleep signal BSLP2 is input, the first power control transistor T5 does not supply the power supply voltage Vcc to the first functional block B1. During the normal mode, for example, when a low-level second inverted sleep signal BSLP2 is input, the first power control transistor T5 supplies the power supply voltage Vcc to the first functional block B1.

The first power control transistor T5 stops the supply of the power supply voltage Vcc to the first functional block B1 in the sleep mode. The first power control transistor T5 supplies the power supply voltage Vcc to the first functional block B1 in the normal mode.

The second power control transistor T6 may be a P-channel MOS transistor. A source of the second power control transistor T6 is coupled to the power supply line LV and a drain of the second power control transistor T6 is coupled to the second functional block B2. A third inverted sleep signal BSLP3 from the second memory macro 12 is supplied to a gate of the second power control transistor T6. In accordance with the third inverted sleep signal BSLP3, the second power control transistor T6 supplies the power supply voltage Vcc to the second functional block B2.

During the sleep mode, for example, when a high-level third inverted sleep signal BSLP3 is input, the second power control transistor T6 does not supply the power supply voltage Vcc to the second functional block B2. During the normal mode, for example, when a low-level third inverted sleep signal BSLP3 is input, the second power control transistor T6 supplies the power supply voltage Vcc to the second functional block B2.

The second power control transistor T6 stops the supply of the power supply voltage Vcc to the second functional block B2 in the sleep mode. The second power control transistor T6 supplies the power supply voltage Vcc to the second functional block B2 in the normal mode.

The third power control transistor T7 is coupled to the third functional block B3, and the fourth power control transistor T8 is coupled to the fourth functional block B4. Other configuration of the third and fourth power control transistors T7 and T8 may be substantially the same as or similar to the configuration of the first and second power control transistors T5 and T6.

In each of the first to fourth memory macros 11 to 14, upon detecting that the low-potential voltage (potential of the virtual power supply lines LK) to be applied to the memory cell arrays 24 has been decreased stepwise to the power supply voltage for the normal mode by the virtual power control circuits 23 during the switch from the sleep mode to the normal mode, the sleep cancellation detecting circuit 18 supplies the power supply voltage Vcc to the corresponding one of the functional blocks B1 to B4. Therefore, power supply noise may be reduced.

In the semiconductor device 60, during the sleep mode, the sleep cancellation detecting circuits 18 in the first to fourth memory macros 11 to 14 stop the supply of the power supply voltage Vcc to the first to fourth functional blocks B1 to B4, respectively, thereby the power consumption in the first to fourth functional blocks B1 to B4 being reduced.

A semiconductor storage device may be controlled in accordance with a chip enable signal CE.

Figure 8:
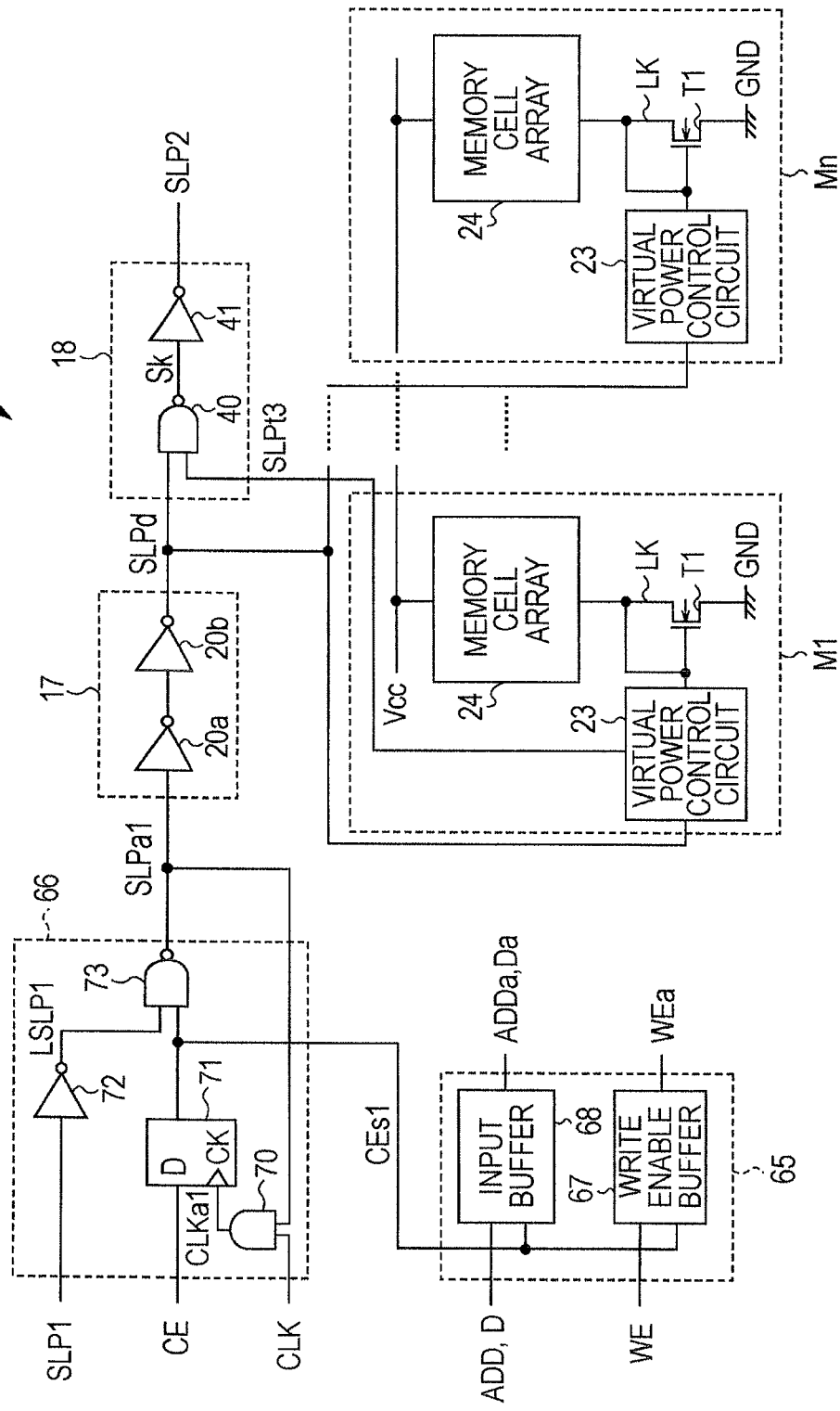
FIG. 8 illustrates an exemplary memory macro.

FIG. 8 illustrates an exemplary memory macro. In FIG. 8, elements that are substantially the same as the elements illustrated in FIGS. 1 to 7 are assigned the same reference numerals, and the explanation may be omitted or reduced.

For example, the first to fourth memory macros 11 to 14 are selected in accordance with a low-level chip enable signal CE. In accordance with a high-level chip enable signal CE (non-memory selection mode), the first to fourth memory macros 11 to 14 stop their operation.

When the chip enable signal CE is at a low level (memory selection mode) and when the first to fourth sleep signals SLP1 to SLP4 are at a low level (sleep mode), the first to fourth memory macros 11 to 14 enter a prohibition mode. When the chip enable signal CE is a high level (non-memory selection mode) and when the first to fourth sleep signals SLP1 to SLP4 are at a high level (normal mode), the first to fourth memory macros 11 to 14 enter a standby mode.

In the prohibition mode, the first to fourth memory macros 11 to 14 may write or read a data signal D under the condition where the power supply voltage to be applied has dropped. Therefore, the first to fourth memory macros 11 to 14 may not write or read the data signal D correctly.

As illustrated in FIG. 8, the first memory macro 11 includes an input circuit 65 and a chip enable control circuit 66. The input circuit 65 includes a write enable buffer 67 and an input buffer 68.

The write enable buffer 67 receives a write enable signal WE from an external device and a first synchronous chip enable signal CEs1 from the chip enable control circuit 66. In accordance with the first synchronous chip enable signal CEs1, the write enable buffer 67 latches the write enable signal WE as a write enable signal WEa.

In accordance with a low-level first synchronous chip enable signal CEs1 (memory selection mode), the write enable buffer 67 latches the write enable signal WE as a write enable signal WEa. In accordance with a high-level first synchronous chip enable signal CEs1 (non-memory selection mode), the write enable buffer 67 does not latch the write enable signal WE.

The write enable buffer 67 may write the data signal D into the memory cell arrays 24 in the first to n-th memory cell array units M1 to Mn in accordance with a low-level first synchronous chip enable signal CEs1. The write enable buffer 67 may not write the data signal D into the memory cell arrays 24 in the first to n-th memory cell array units M1 to Mn in accordance with a high-level first synchronous chip enable signal CEs1.

The input buffer 68 receives an address signal ADD and a data signal D from an external device and a first synchronous chip enable signal CEs1 from the chip enable control circuit 66. In accordance with the first synchronous chip enable signal CEs1, the input buffer 68 latches the address signal ADD and the data signal D as an address signal ADDa and a data signal Da, respectively.

In accordance with a low-level first synchronous chip enable signal CEs1 (memory selection mode), the input buffer 68 latches the address signal ADD and the data signal D as an address signal ADDa and a data signal Da, respectively. In accordance with a high-level first synchronous chip enable signal CEs1 (non-memory selection mode), the input buffer 68 may not latch the address signal ADD and the data signal D.

When the first synchronous chip enable signal CEs1 is at a low level (memory selection mode), a word line and a bit line (not illustrated) are selected in accordance with the write enable signal WEa latched in the write enable buffer 67 and the address signal ADDa and data signal Da latched in the input buffer 68. Thus, the data signal D is written into or read from the first to n-th memory cell array units M1 to Mn.

When the first synchronous chip enable signal CEs1 is at a high level (non-memory selection mode), the data signal D may not be written into or read from the first to n-th memory cell array units M1 to Mn.

The configuration of the second to fourth memory macros 12 to 14 may be substantially the same as or similar to the configuration of the first memory macro 11.

The first to fourth memory macros 11 to 14 sequentially receive first to fourth sleep signal SLP1 to SLP4, respectively. The first to fourth sleep signals SLP1 to SLP4 are delayed by wire delay or the like. During the switching between the sleep mode and the normal mode based on a chip enable signal CE supplied from an external device, the first to fourth memory macros 11 to 14 may be switched to the prohibition mode or standby mode, rather than the normal mode or sleep mode, because of the delayed first to fourth sleep signals SLP1 to SLP4.

When the sleep mode is switched to the normal mode, the first to fourth memory macros 11 to 14 may enter the prohibition mode because the chip enable signal CE becomes a low level (chip selection mode) before the first to fourth sleep signals SLP1 to SLP4 rise from the low level (sleep mode) to the high level (normal mode).

When the normal mode is switched to the sleep mode, the first to fourth memory macros 11 to 14 may enter the standby mode because the chip enable signal CE becomes a high level (non-chip selection mode) before the first to fourth sleep signals SLP1 to SLP4 fall from the high level (normal mode) to the low level (sleep mode).

Each of the memory macros 11 to 14 may include the chip enable control circuit 66 that controls the input timing of a chip enable signal CE from an external device.

The chip enable control circuit 66 includes an AND circuit 70, a D flip-flop (D-FF) circuit 71, an inverter circuit 72, and a NAND circuit 73. The AND circuit 70 is supplied with a clock signal CLK from an external device and is also supplied with a first adjusted sleep signal SLPa1 from the NAND circuit 73. In accordance with the clock signal CLK and the first adjusted sleep signal SLPa1, the AND circuit 70 outputs a first adjusted clock signal CLKa1 to a clock terminal CK of the D-FF circuit 71.

When the clock signal CLK and the first adjusted sleep signal SLPa1 are at a high level, the AND circuit 70 outputs a high-level first adjusted clock signal CLKa1 to the clock terminal CK of the D-FF circuit 71. When the first adjusted sleep signal SLPa1 becomes a high level (normal mode), the AND circuit 70 outputs the clock signal CLK to the clock terminal CK of the D-FF circuit 71 as the first adjusted sleep signal SLPa1.

A chip enable signal CE supplied from an external device is input to a data input terminal D of the D-FF circuit 71. The first adjusted clock signal CLKa1 supplied from the AND circuit 70 is input to the clock terminal CK of the D-FF circuit 71.

When the first adjusted clock signal CLKa1 rises to a high level, the D-FF circuit 71 holds the chip enable signal CE and further outputs the chip enable signal CE to the input circuit 65 and the NAND circuit 73 as a first synchronous chip enable signal CEs1.

During the switching from the sleep mode to the normal mode, when the chip enable signal CE falls from the high level (non-chip selection mode) to the low level (chip selection mode), the D-FF circuit 71 outputs a low-level (chip selection mode) first synchronous chip enable signal CEs1 to the input circuit 65 and the NAND circuit 73 in accordance with the first adjusted clock signal CLKa1.

During the switching from the sleep mode to the normal mode, when the chip enable signal CE falls from the high level (non-chip selection mode) to the low level (chip selection mode), the first adjusted clock signal CLKa1 is not input and the D-FF circuit 71 maintains the output of the high-level (non-chip selection mode) first synchronous chip enable signal CEs1.

During the switching from the sleep mode to the normal mode, even when a low-level (chip selection mode) chip enable signal CE is input, the D-FF circuit 71 does not output the low-level (chip selection mode) first synchronous chip enable signal CEs1 to the input circuit 65 or the NAND circuit 73 until the first adjusted clock signal CLKa1 is input.

In accordance with a first sleep signal SLP1 supplied from an external device, the inverter circuit 72 inverts the first sleep signal SLP1 to obtain a first logic sleep signal LSLP1, and outputs the first logic sleep signal LSLP1 to the NAND circuit 73.

The NAND circuit 73 is supplied with the first logic sleep signal LSLP1 from the inverter circuit 72, and is also supplied with the first synchronous chip enable signal CEs1 from the D-FF circuit 71. When the first logic sleep signal LSLP1 and the first synchronous chip enable signal CEs1 are at a high level, the NAND circuit 73 outputs a low-level (sleep mode) first adjusted sleep signal SLPa1 to the drive circuit 17 and the AND circuit 70.

When the sleep mode is switched to the normal mode, for example, when the first sleep signal SLP1 changes from the low level (sleep mode) to the high level (normal mode) in accordance with a high-level (non-chip selection mode) first synchronous chip enable signal CEs1, the NAND circuit 73 also sets the first adjusted sleep signal SLPa1 from the low level (sleep mode) to the high level (normal mode).

When the normal mode is switched to the sleep mode, since a low-level (chip selection mode) first synchronous chip enable signal CEs1 is input, the NAND circuit 73 maintains the output of the high-level (normal mode) first adjusted sleep signal SLPa1 even when the first sleep signal SLP1 changes from the high level (normal mode) to the low level (sleep mode).

In accordance with a high-level (non-chip selection mode) first synchronous chip enable signal CEs1, the NAND circuit 73 causes the first adjusted sleep signal SLPa1 to fall from the high level (normal mode) to the low level (sleep mode).

When the sleep mode is switched to the normal mode, even when a low-level (chip selection mode) chip enable signal CE is input, the chip enable control circuit 66 may not output the low-level (chip selection mode) first synchronous chip enable signal CEs1 to the input circuit 65 until the clock signal CLK rises in accordance with a high-level (normal mode) first sleep signal SLP1.

When the clock signal CLK rises in accordance with a high-level (normal mode) first sleep signal SLP1, the chip enable control circuit 66 outputs a low-level (chip selection mode) first synchronous chip enable signal CEs1 to the input circuit 65.

When the normal mode is switched to the sleep mode, even when a high-level (non-chip selection mode) chip enable signal CE is input, the chip enable control circuit 66 may not output the high-level (non-chip selection mode) first synchronous chip enable signal CEs1 to the input circuit 65 until the clock signal CLK rises in accordance with a low-level (sleep mode) first sleep signal SLP1.

When the clock signal CLK rises in accordance with a low-level (sleep mode) first sleep signal SLP1, the chip enable control circuit 66 outputs a high-level (non-chip selection mode) first synchronous chip enable signal CEs1 to the input circuit 65.

In each of the first to fourth memory macros 11 to 14, when the sleep mode is switched to the normal mode, the corresponding one of the first to fourth sleep signals SLP1 to SLP4 rises to the high level (normal mode) and then the first synchronous chip enable signal CEs1 falls to the low level (chip selection mode).

In each of the first to fourth memory macros 11 to 14, when the normal mode is switched to the sleep mode, the corresponding one of the first to fourth sleep signals SLP1 to SLP4 falls to the low level (sleep mode) and then the first synchronous chip enable signal CEs1 rises to the high level (non-chip selection mode).

Therefore, the first to fourth memory macros 11 to 14 do not enter the prohibition mode or standby mode during the switching between the normal mode and the sleep mode.

In the embodiment described above, the semiconductor storage device 10 includes the first to fourth memory macros 11 to 14. A semiconductor storage device may include any number of memory macros. Furthermore, each memory macro may include any number of memory cell array units.

In the embodiment described above, the third delayed sleep signal SLPt3 is supplied to the sleep cancellation detecting circuits 18. The first delayed sleep signal SLPt1 or the second delayed sleep signal SLPt2 may be supplied.

In the embodiment described above, the third delayed sleep signal SLPt3 output from the first memory cell array units M1 is supplied to the sleep cancellation detecting circuits 18. The third delayed sleep signal SLPt3 may be supplied from the second to n-th memory cell array units M2 to Mn. In the embodiment described above, the N-channel MOS transistors T1 are provided between the memory cell arrays 24 and the ground potential GND so that the low-potential power supply voltage of the memory cell arrays 24 is increased to the threshold voltage of the N-channel MOS transistors T1 in the sleep mode, thereby achieving a reduction in power consumption.

A high-potential power supply step-down circuit may be provided between each of the memory cell arrays 24 and the power supply voltage Vcc. The high-potential power supply step-down circuit includes two P-channel MOS transistors that are coupled in parallel. The high-potential power supply voltage of the memory cell arrays 24 is decreased by the threshold voltage of the P-channel MOS transistors in the sleep mode, thereby providing reduced power consumption.

The gate of one of the P-channel MOS transistors provided between each of the memory cell arrays 24 and the power supply voltage Vcc is coupled to the drains of the first to fourth transistors Ta to Td in the corresponding one of the virtual power control circuits 23. A high-potential power supply voltage is coupled to the gate of the other P-channel MOS transistor provided between the memory cell array 24 and the power supply voltage Vcc.

The first to fourth transistors Ta to Td, which are N-channel MOS transistors, in each of the virtual power control circuits 23 may be replaced by P-channel MOS transistors. The power supply voltage that is coupled to the sources of the first to fourth transistors Ta to Td in each of the virtual power control circuits 23 may be the power supply voltage Vcc instead of the ground potential GND.

Figure 9:
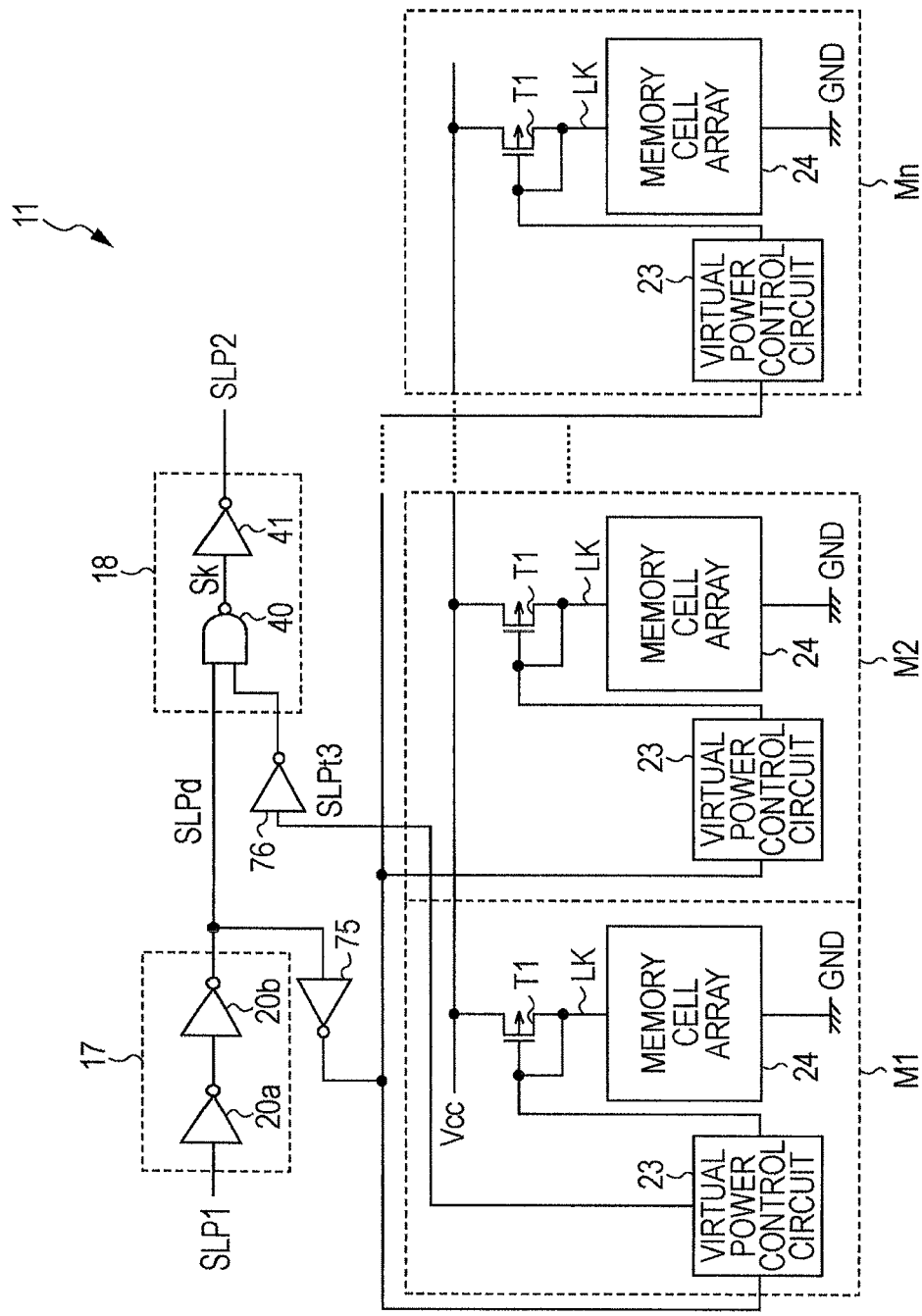
FIG. 9 illustrates an exemplary memory macro.

FIG. 9 illustrates an exemplary a memory macro. Referring to FIG. 9, the gate of a P-channel MOS transistor provided between each of memory cell arrays 24 and the power supply voltage Vcc is coupled to the drains of first to fourth transistors Ta to Td in a corresponding one of virtual power control circuits 23.

As illustrated in FIG. 9, an inverter circuit 75 for inverting a driven sleep signal SLPd is provided between a drive circuit 17 and virtual power control circuits 23 in first to n-th memory cell array units M1 to Mn. An inverter circuit 76 for inverting a third delayed sleep signal SLPt3 is provided between the virtual power control circuit 23 in the n-th memory cell array unit Mn and a sleep cancellation detecting circuit 18.

A P-channel MOS transistor may be provided between each of the memory cell arrays 24 and the power supply voltage Vcc. In the sleep mode, the voltage of the high-potential power supply of the memory cell arrays 24 is reduced by the threshold voltage of the P-channel MOS transistors. An N-channel MOS transistor may be provided between each of the memory cell arrays 24 and the ground potential GND. In the sleep mode, the voltage of the low-potential power supply of the memory cell arrays 24 is increased by the threshold voltage of the N-channel MOS transistors, thereby providing reduced power consumption.

Since a power supply voltage that is lower by the threshold voltage of the transistors is applied to the memory cell arrays 24, power consumption is further reduced. In the embodiment described above, the first to fourth functional blocks B1 to B4 are supplied with the power supply voltage Vcc through the first to fourth power control transistors T5 to T8, respectively.

Figure 10:
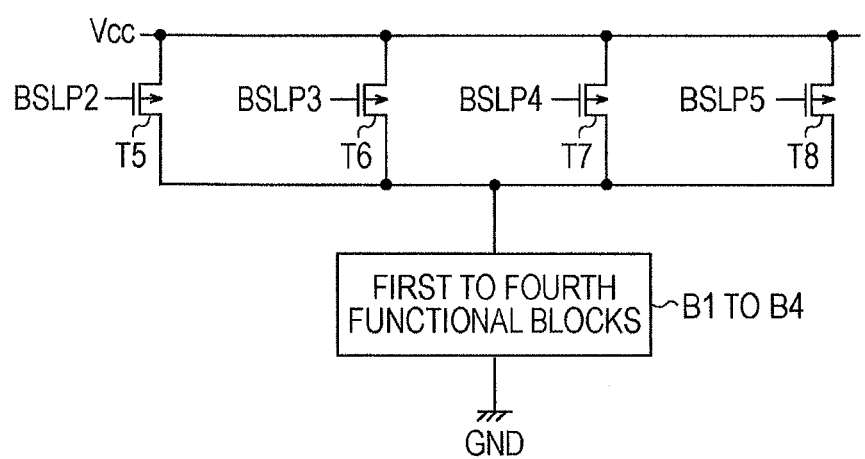
FIG. 10 illustrates an exemplary semiconductor device.

FIG. 10 illustrates an exemplary semiconductor device. In the semiconductor device illustrated in FIG. 10, first to fourth functional blocks B1 to B4 are coupled to the drains of first to fourth power control transistors T5 to T8. The first to fourth functional blocks B1 to B4 are supplied with a power supply voltage from the drains of the first to fourth power control transistors T5 to T8, which are coupled in parallel.

Since the first to fourth power control transistors T5 to T8 are sequentially turned on when the sleep mode is switched to the normal mode, impedance gradually decreases.

Since the impedance of the first to fourth power control transistors T5 to T8 gradually decreases when the sleep mode is switched to the normal mode, the current supplied to the first to fourth functional blocks B1 to B4 gradually increases. Therefore, when the sleep mode is switched to the normal mode, the current flowing through the first to fourth functional blocks B1 to B4 is reduced to reduce power supply noise.

The first to fourth power control transistors T5 to T8 have any transistor size. For example, when the first to fourth power control transistors T5 to T8 have substantially the same transistor size, the impedance of the first to fourth power control transistors T5 to T8, which are coupled in parallel, decreases in proportion to the number of power control transistors that are turned on among the first to fourth power control transistors T5 to T8. Accordingly, the current flowing through the first to fourth functional blocks B1 to B4 increases in proportion to the number of power control transistors that are turned on among the first to fourth power control transistors T5 to T8.

For example, as the transistor sizes of the first to fourth power control transistors T5 to T8 increase in order, the impedance of the first to fourth power control transistors T5 to T8, which are coupled in parallel, slowly increases each time the first to fourth power control transistors T5 to T8 are turned on. Accordingly, the current flowing through the first to fourth functional blocks B1 to B4 slowly increases each time the first to fourth power control transistors T5 to T8 are turned on.

In the embodiment described above, when the chip enable signal CE is at a low level (chip selection mode), the chip enable control circuit 66 outputs a low-level (chip selection mode) first synchronous chip enable signal CEs1 to the input circuit 65 after a high-level (normal mode) first sleep signal SLP1 is input and thereafter the clock signal CLK rises.

Figure 11:
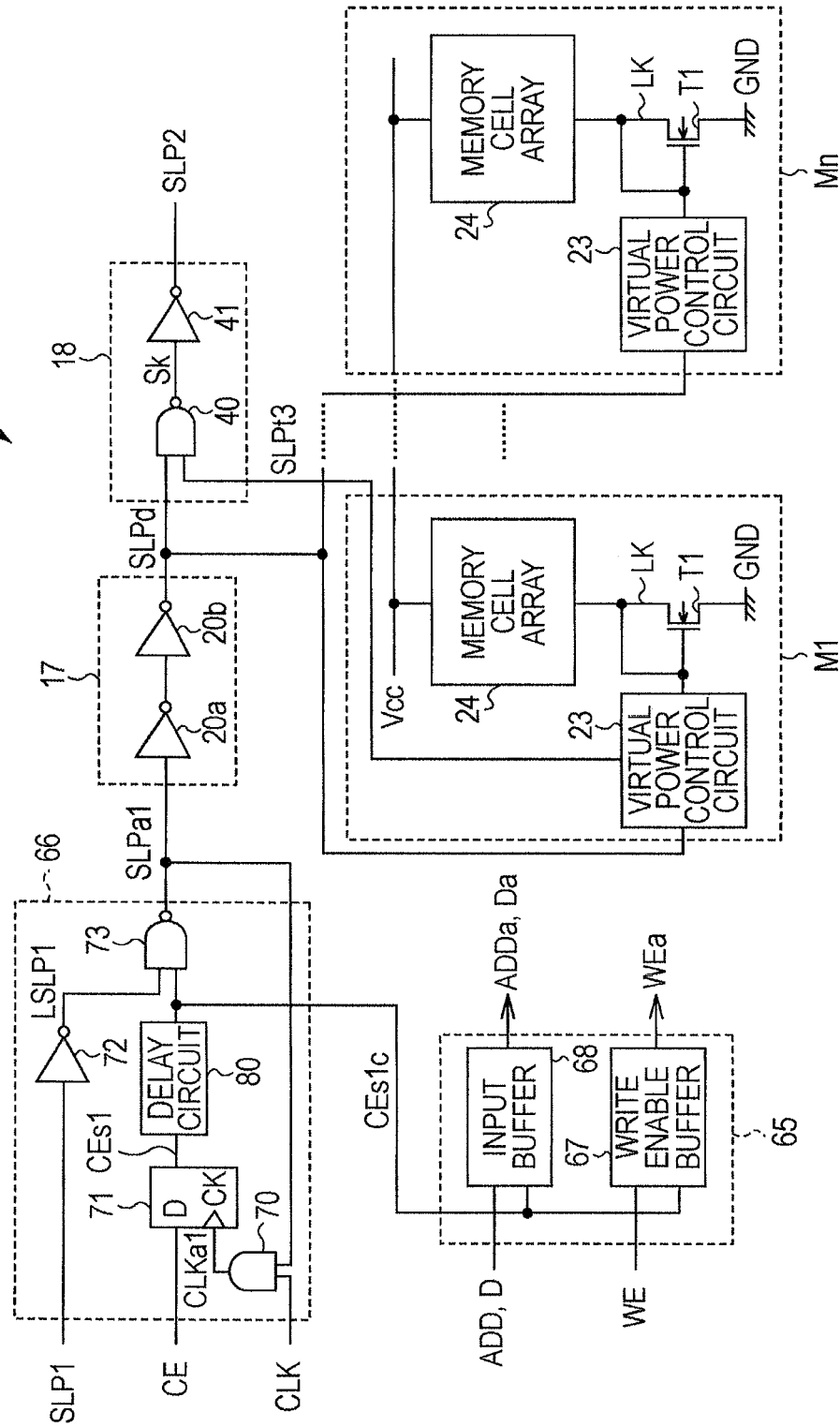
FIG. 11 illustrates an exemplary memory macro.

FIG. 11 illustrates an exemplary memory macro. A chip enable control circuit 66 illustrated in FIG. 11 may include a delay circuit 80 for delaying a first synchronous chip enable signal CEs1, which is provided between a D-FF circuit 71 and a NAND circuit 73. Since the first synchronous chip enable signal CEs1 is delayed in the chip enable control circuit 66, transition to the prohibition mode is reliably prevented.

Figure 12:
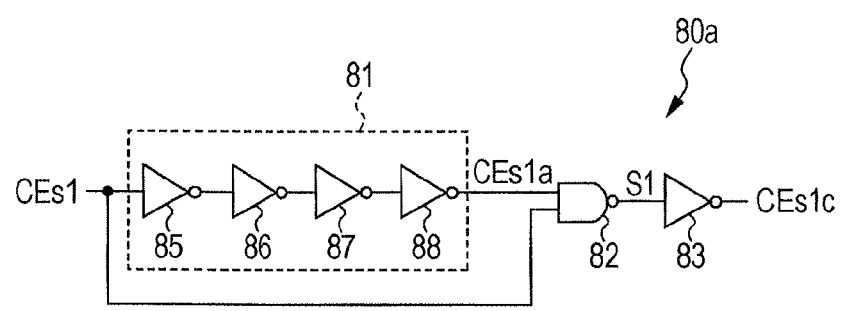
FIG. 12 illustrates an exemplary delay circuit.

FIG. 12 illustrates an exemplary delay circuit. A delay circuit 80a illustrated in FIG. 12 may the delay circuit 80 illustrated in FIG. 11. The delay circuit 80a illustrated in FIG. 12 includes a delay unit 81, a NAND circuit 82, and an inverter circuit 83. The delay unit 81 includes a series circuit having inverter circuits 85 to 88. The delay unit 81 delays a first synchronous chip enable signal CEs1 output from the D-FF circuit 71 to obtain a first synchronous chip enable signal CEs1a, and outputs the first synchronous chip enable signal CEs1a to the NAND circuit 82.

The NAND circuit 82 is supplied with the first synchronous chip enable signal CEs1a from the delay unit 81, and is also supplied with the first synchronous chip enable signal CEs1 from the D-FF circuit 71. When the first synchronous chip enable signals CEs1 and CEs1a are at a high level, the NAND circuit 82 outputs a low-level logic signal S1 to the inverter circuit 83.

The inverter circuit 83 inverts the logic signal S1 output from the NAND circuit 82 to obtain a first synchronous chip enable signal CEs1c, and outputs the first synchronous chip enable signal CEs1c to the input circuit 65. The delay circuit 80a delays the first synchronous chip enable signal CEs1 by an delay time of the delay unit 81 to obtain a first synchronous chip enable signal CEs1c, and outputs the first synchronous chip enable signal CEs1c to the input circuit 65.

Figure 13:
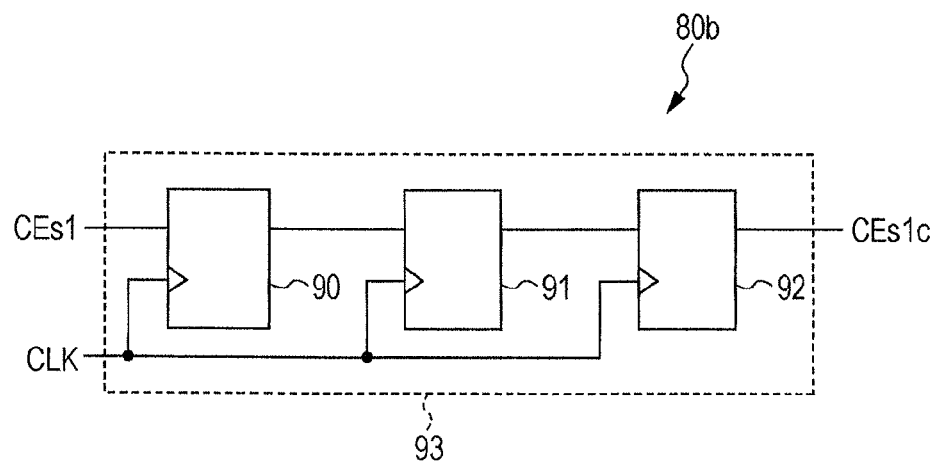
FIG. 13 illustrates an exemplary delay circuit.

FIG. 13 illustrates an exemplary delay circuit. A delay circuit 80b illustrated in FIG. 13 may be the delay circuit 80 illustrated in FIG. 11. The delay circuit 80b illustrated in FIG. 13 includes a delay unit 93 including D-FF circuits 90 to 92. The delay unit 93 receives a first synchronous chip enable signal CEs1 from the D-FF circuit 71 illustrated in FIG. 11. Then, after the clock signal CLK rises three times, the first synchronous chip enable signal CEs1 is output as a first synchronous chip enable signal CEs1c to the input circuit 65.

Therefore, the delay circuit 80b delays the first synchronous chip enable signal CEs1 by an delay time of the delay unit 93 to obtain a first synchronous chip enable signal CEs1c, and outputs the first synchronous chip enable signal CEs1c to the input circuit 65.

Exemplary aspects of the present invention have now been described in accordance with the above advantages. It will be appreciated that these examples are merely illustrative of the invention. Many variations and modifications will be apparent to those skilled in the art.

What is claimed is:
1. A circuit semiconductor storage device comprising:
a plurality of memory macros coupled in series, each of the plurality of memory macros including a plurality of memory cell arrays;
a high-potential power supply step-down circuit provided for each of the plurality of memory cell arrays, the high-potential power supply step-down circuit provided between a high-potential power supply and a respective memory cell array, the high-potential power supply step-down circuit being configured to couple the high-potential power supply to the respective memory cell array in a normal mode and configured to couple the respective memory cell array to a voltage level lower than the high-potential power supply in a sleep mode;

a virtual power control circuit provided for each of the plurality of memory cell arrays, the virtual power control circuit including a plurality of switches provided in parallel with the high-potential power supply step-down circuit, each of the plurality of switches supplying an output to the high-potential power supply step-down circuit independent of every other one of the plurality of switches, the plurality of switches being configured to be turned on when a mode control signal indicates to switch from the sleep mode to the normal mode and configured to be turned off when a mode control signal indicates to switch from the normal mode to the sleep mode; and a sleep cancellation detecting circuit configured to receive the mode control signal and to output a subsequent mode control signal to a subsequent memory macro subsequent to one of the plurality of memory macros when the mode control signal supplied to the plurality of switches of one of the plurality of memory cell arrays in the one of the plurality of memory macros indicates to switch from the sleep mode to the normal mode.

2. The circuit semiconductor storage device according to claim 1, wherein the mode control signal is contemporaneously input to one of the plurality of switches of the plurality of the memory cell arrays.

3. The circuit semiconductor storage device according to claim 1, wherein, when the mode control signal is input to the plurality of switches sequentially, the sleep cancellation detecting circuit detects a last mode control signal that is input last to the plurality of switches.

4. The circuit semiconductor storage device according to claim 1, wherein, when the mode control signal is input to the plurality of switches sequentially, a last mode control signal that is input last to the plurality of switches is supplied to the subsequent memory macro, and wherein the sleep cancellation detecting circuit detects the last mode control signal in a last memory macro of the plurality of memory macros coupled in series.

* * * * *